US012507447B2

(12) United States Patent
Fulford et al.

(10) Patent No.: US 12,507,447 B2
(45) Date of Patent: Dec. 23, 2025

(54) 3D ADVANCED TRANSISTOR ARCHITECTURE INTEGRATED WITH SOURCE/DRAIN SPIDER DESIGN

(71) Applicant: Tokyo Electron Limited, Tokyo (JP)

(72) Inventors: H. Jim Fulford, Albany, NY (US); Mark I. Gardner, Albany, NY (US); Partha Mukhopadhyay, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 776 days.

(21) Appl. No.: 17/672,426

(22) Filed: Feb. 15, 2022

(65) Prior Publication Data

US 2023/0261041 A1    Aug. 17, 2023

(51) Int. Cl.
| | | |
|---|---|---|
| *H10D 62/10* | (2025.01) | |
| *H10D 30/01* | (2025.01) | |
| *H10D 30/67* | (2025.01) | |
| *H10D 64/23* | (2025.01) | |
| *H10D 84/01* | (2025.01) | |
| *H10D 84/03* | (2025.01) | |
| *H10D 84/85* | (2025.01) | |

(52) U.S. Cl.
CPC ......... *H10D 62/105* (2025.01); *H10D 30/031* (2025.01); *H10D 30/6713* (2025.01); *H10D 30/6729* (2025.01); *H10D 30/6735* (2025.01); *H10D 30/6757* (2025.01); *H10D 62/118* (2025.01); *H10D 64/258* (2025.01); *H10D 84/0167* (2025.01); *H10D 84/017* (2025.01); *H10D 84/0186* (2025.01); *H10D 84/038* (2025.01); *H10D 84/85* (2025.01)

(58) Field of Classification Search
CPC ............. H01L 29/0615; H01L 29/0665; H01L 21/823871; H01L 21/823814; H01L 21/823807; H01L 29/78696; H01L 29/78618; H01L 29/66742; H01L 29/42392; H10D 62/105; H10D 62/80; H10D 62/121; H10D 64/017; H10D 84/0128; H10D 84/151; H10D 84/83; H10D 88/00; H10D 88/01; H10D 99/00
USPC ......................................................... 257/335
See application file for complete search history.

(56) References Cited

U.S. PATENT DOCUMENTS 9,024,376 B2   5/2015 Masuoka et al.
9,425,324 B2 * 8/2016 Diaz ................. H10D 30/6758
(Continued)

FOREIGN PATENT DOCUMENTS

CN      112750822 A * 5/2021 ....... H01L 21/76224

*Primary Examiner* — Fazli Erdem
(74) *Attorney, Agent, or Firm* — Foley & Lardner LLP

(57) ABSTRACT

One or more 3D transistor structures that use one or more 2D materials as transistor channels along with methods for fabricating the same are disclosed. A 3D transistor can include a source contact, a drain contact, a 2D material forming a channel between the source and drain contacts and surrounding a carrier nanosheet forming a first p-n junction with the source contact and a second p-n junction with the drain contact, and a gate structure comprising a gate dielectric and a gate contact contacting at least a portion of the channel between the first p-n junction and the second p-n junction. The source and drain contacts can comprise a doped semiconductor material and a channel having a first curved profile extending along the source contact and a second curved profile extending along the drain contact.

11 Claims, 32 Drawing Sheets

(56) References Cited

U.S. PATENT DOCUMENTS

| | | | |
|---|---|---|---|
| 9,478,624 B2 | 10/2016 | Colinge et al. | |
| 10,714,601 B2 * | 7/2020 | Colinge | H01L 21/76224 |
| 2020/0357931 A1 * | 11/2020 | Lee | H10D 30/014 |
| 2021/0066506 A1 * | 3/2021 | Liaw | H10D 62/105 |

* cited by examiner

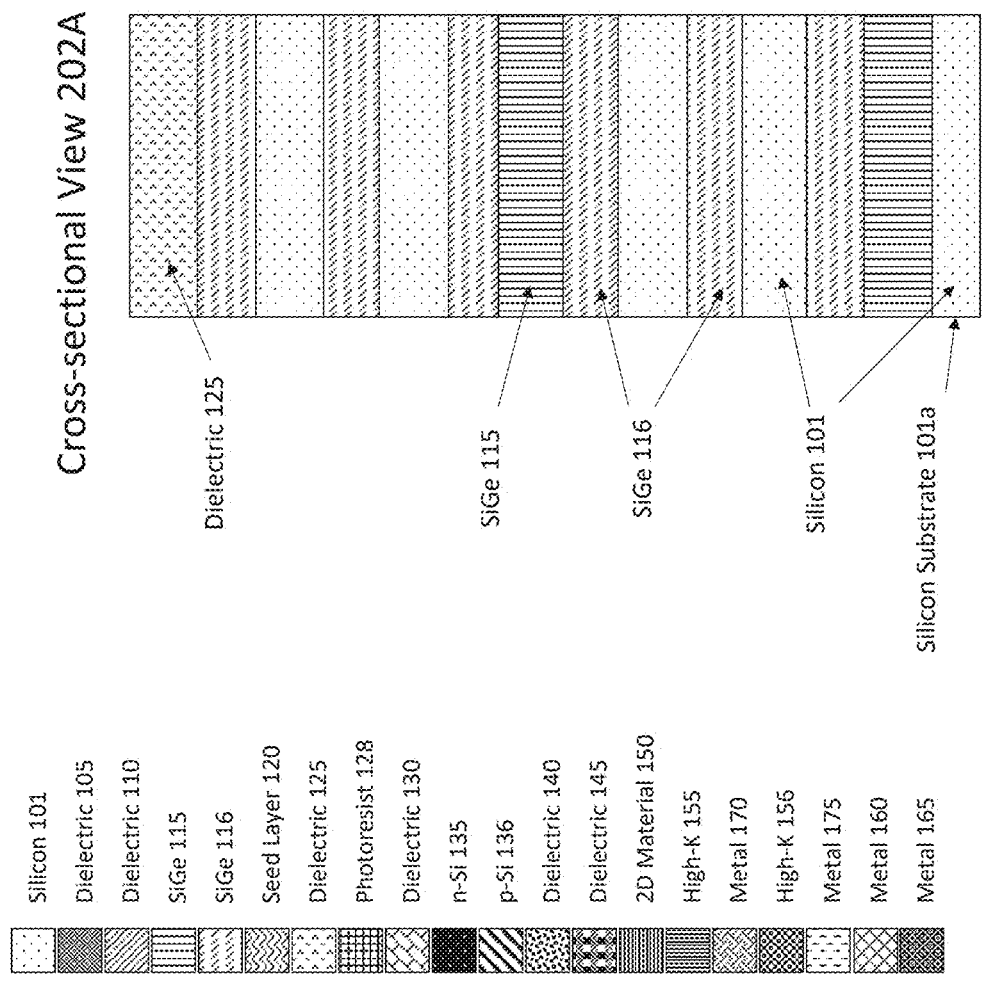
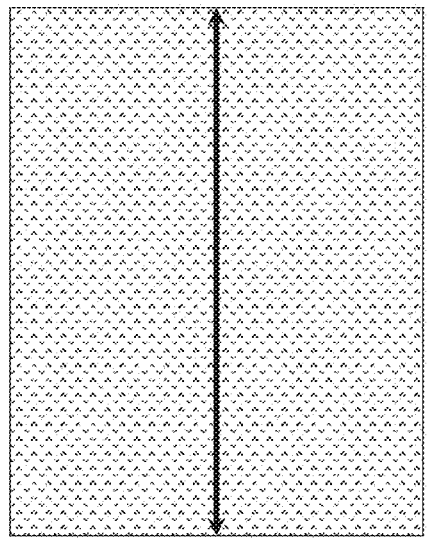
FIG. 2A

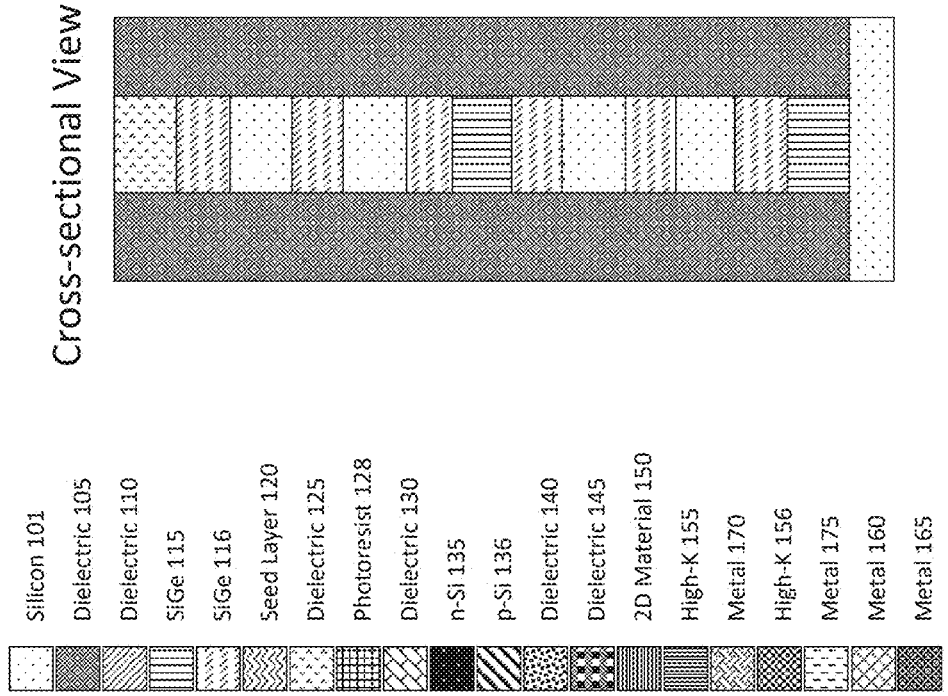
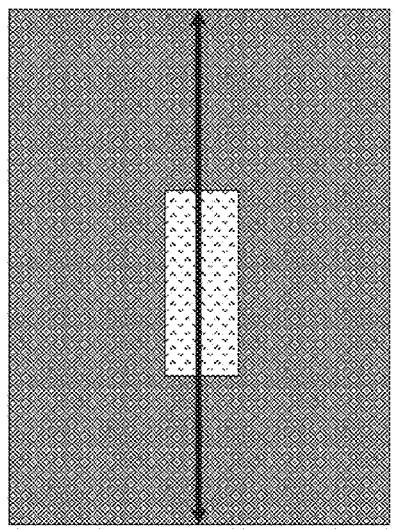
FIG. 2B

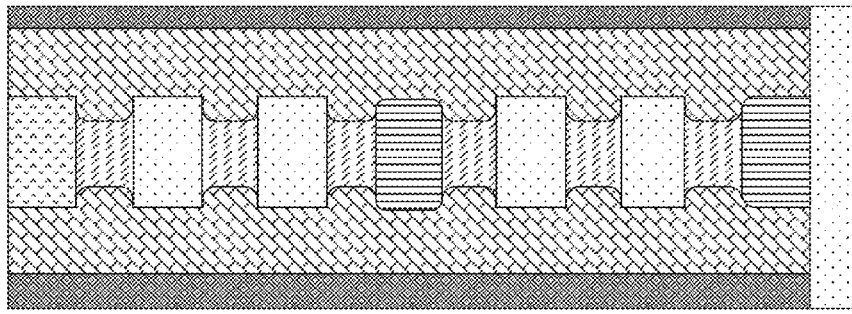
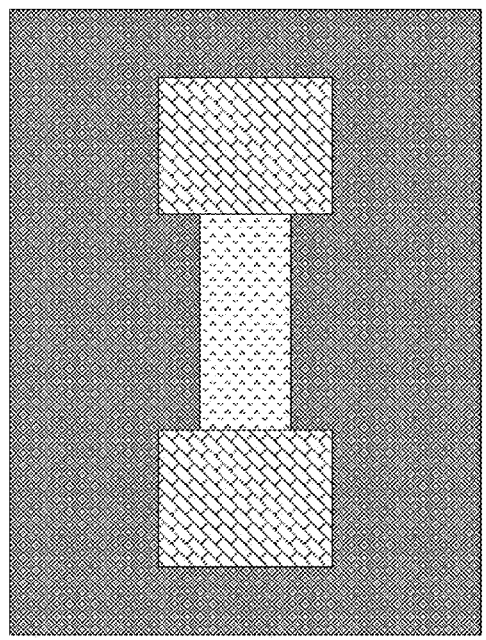
FIG. 5

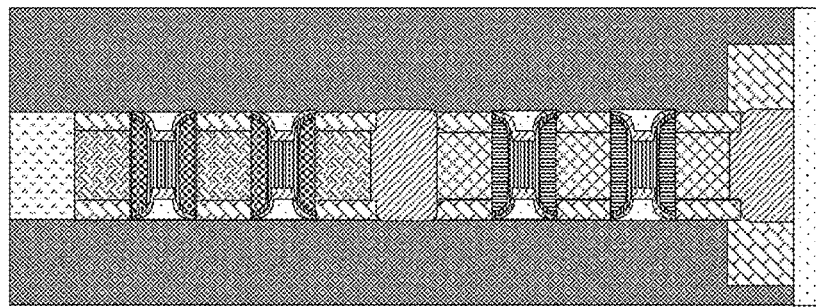
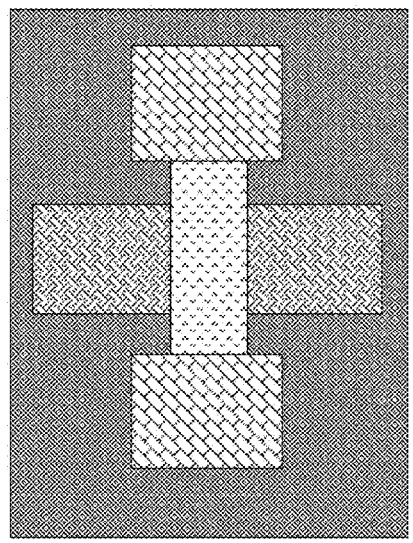
FIG. 15

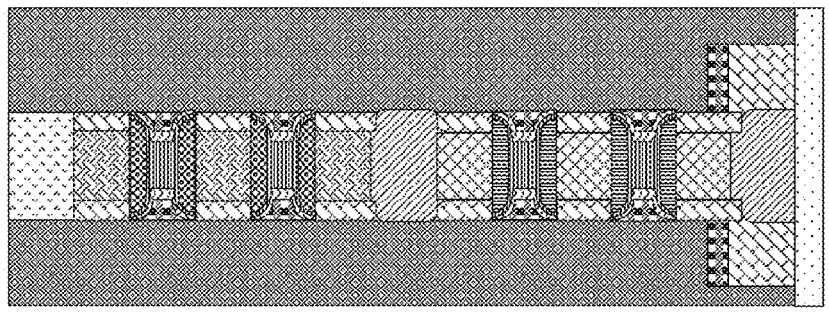
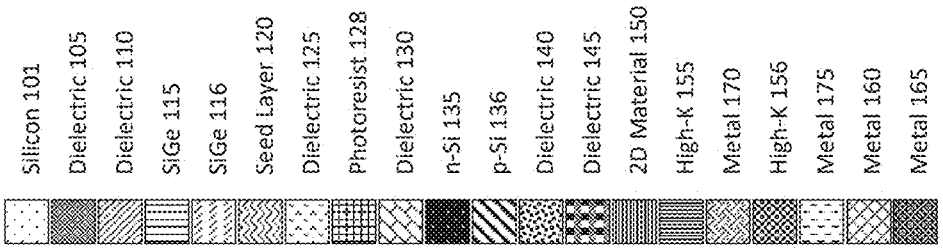
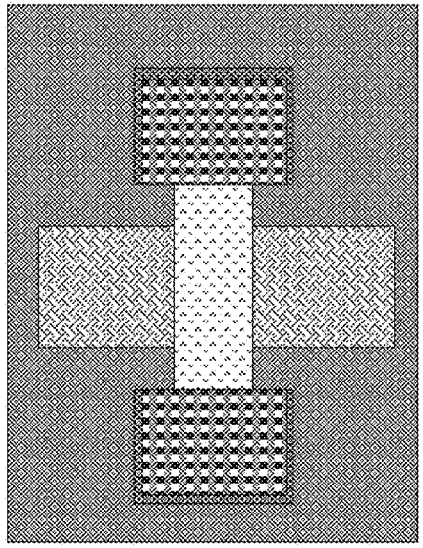
FIG. 16

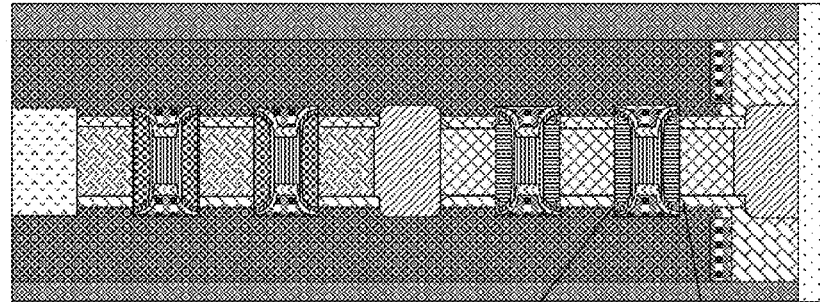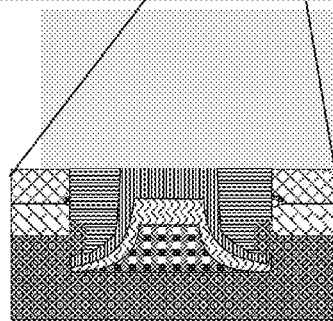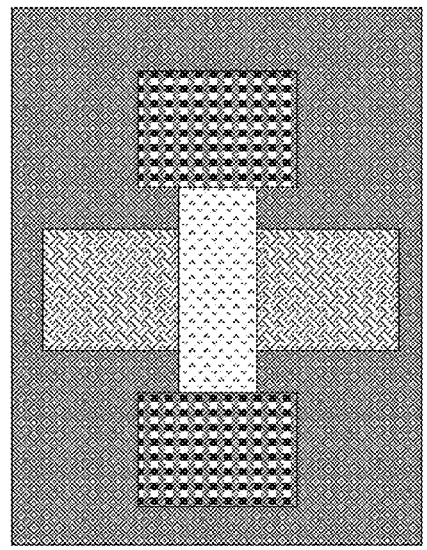
FIG. 18

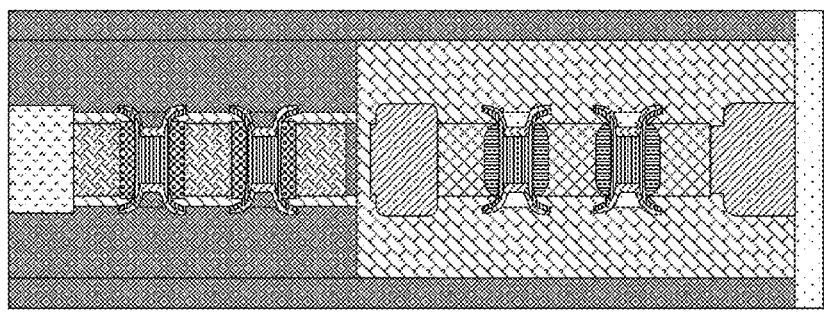
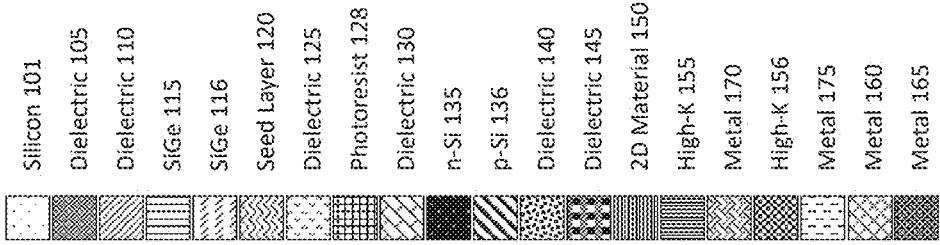
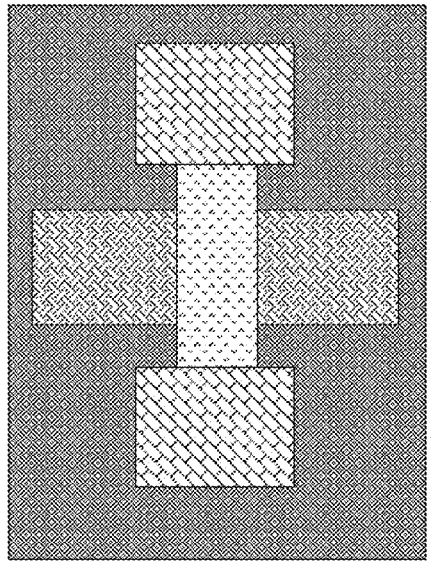
FIG. 22

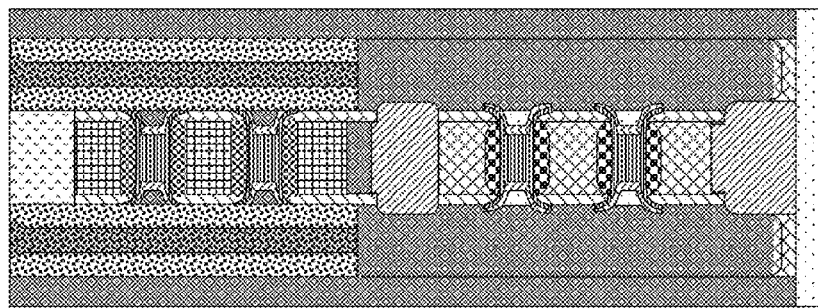
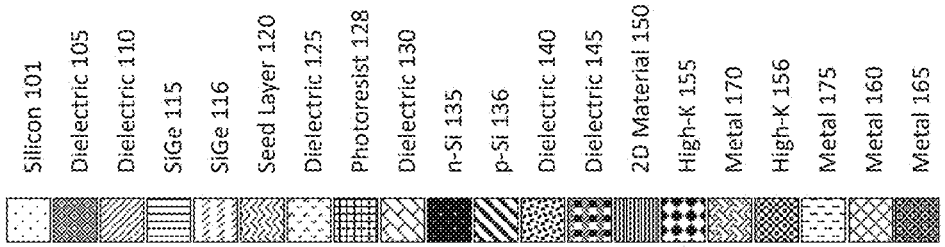
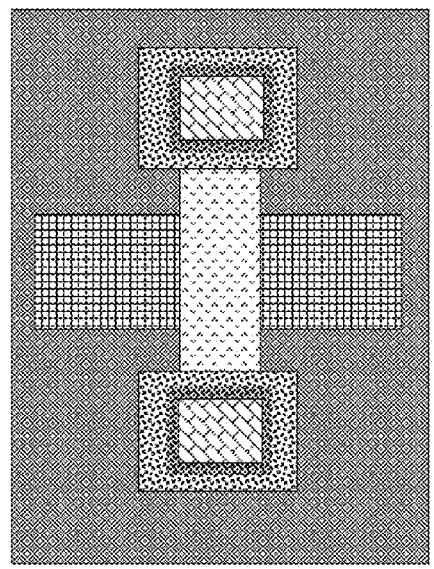
FIG. 23

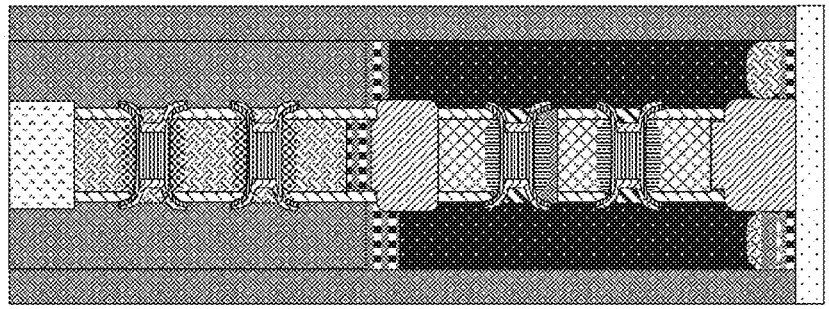
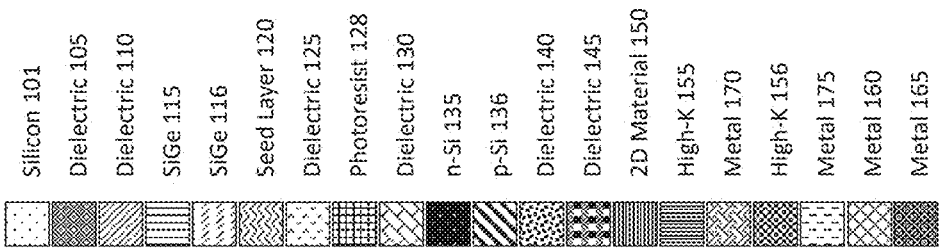
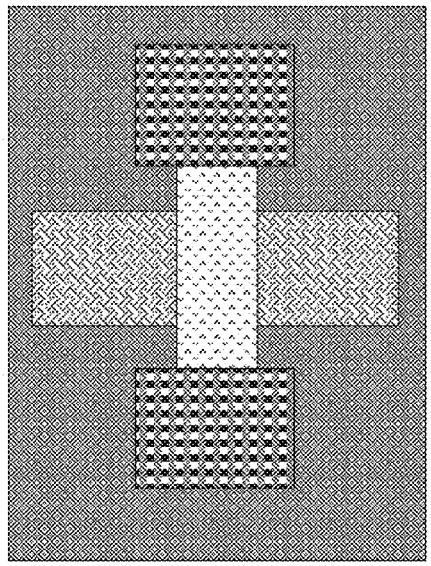
FIG. 28

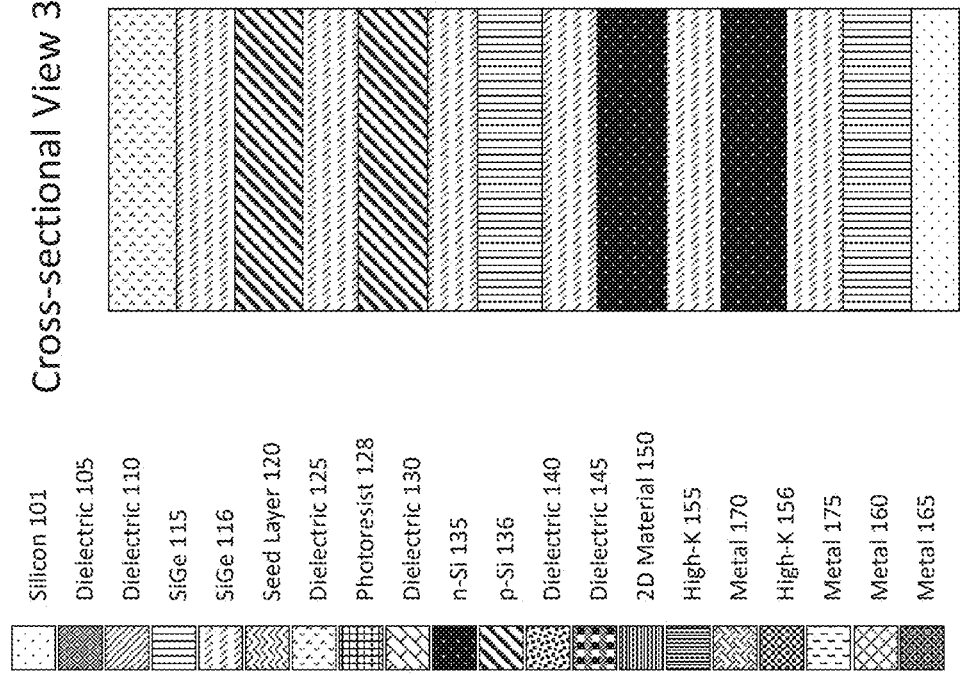
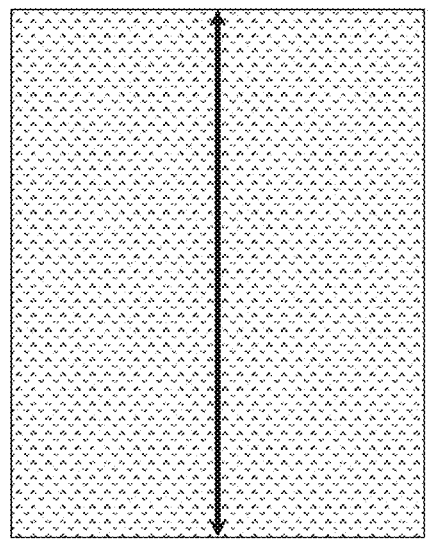
FIG. 30

3D ADVANCED TRANSISTOR ARCHITECTURE INTEGRATED WITH SOURCE/DRAIN SPIDER DESIGN

TECHNICAL FIELD

The present invention relates generally to the field of manufacturing semiconductor devices.

BACKGROUND

Modern semiconductor integrated circuit device fabrication normally relies on well-established processes, such as film-forming depositions, etch mask creation, patterning, material etching and removal, and doping treatments, many of which are performed repeatedly to form desired circuits on a substrate. At the same time, the semiconductor industry has been facing a challenge in scaling down and continuing to improve the performance of integrated circuits to reduce their power consumption while increasing their rate of operation. In conventional integrated circuit fabrication, structures are usually manufactured in one plane, while wiring or metallization layers are typically be formed above the active device plane. Integrated circuits manufactured using these techniques are typically characterized as two-dimensional (2D) circuits. Although scaling efforts in the 2D circuit fabrication space had over the years improved, resulting in a larger number of transistors per unit area, continued improvement has recently stalled as individual transistor feature sizes have approached physical atomic limitations on the order of only single nanometers. Facing this challenge, device fabricators have expressed a desire for new solutions.

SUMMARY

Faced with the challenge of fabricating transistors whose feature sizes can be on the order of only several atoms thick, fabricators of integrated circuits ("IC") find it increasingly difficult to overcome technical issues, such as leakage currents and short-channel effects. The solution provided herein addresses these and other similar challenges by providing nanosheet-based design for fabricating transistors with 2D material layers used to form the transistor channels and source and drain contacts that can be made using metal or with grown epitaxial doped regions.

The present solution can utilize recessed silicon to open access for channel to connect to source and drain. It can also use a seed layer formed on silicon nanosheet in order to selectively form or deposit 2D material layer on the seed layers. The transistor channel can therefore connect source and drain regions using 2D material layers that are supported on silicon nanosheet with an interposed seed layer between the nanosheet and the 2D material. The transistor channel can further be interfaced with a gate structure, which can partially or fully surround, envelop or encircle the 2D material channel, including by forming a gate-all-around ("GAA") structure around the channel. In doing so, this solution can enable existing IC fabrication facilities and techniques to be used to continue scaling down transistors using existing tools and techniques, while making the transition of the IC fabrication industry to this new technology more simple and cost effective.

In some aspects the present disclosure relates to a device that can be a transistor device. The device can include a source contact and a drain contact. The device can also include a 2D material forming a channel between the source and drain contacts and surrounding a carrier nanosheet. The carrier nanosheet can form a first p-n junction with the source contact and a second p-n junction with the drain contact. The device can also include a gate structure comprising a gate dielectric and a gate contact. The gate structure can contact at least a portion of the channel between the first p-n junction and the second p-n junction. In some embodiments, the gate structure forms a gate all around structure surrounding the channel.

In some embodiments, the device can include at least one of the source contact or the drain contact that comprise a doped semiconductor material. The doped semiconductor material can include an epitaxially grown n-type or p-type semiconductor, such as silicon. The device can also include the 2D material forming a channel that includes a first curved profile extending along the source contact and a second curved profile extending along the drain contact.

The device can include the carrier nanosheet that comprises silicon. The device can also include a first portion of the silicon carrier nanosheet doped to form the first p-n junction, and a second portion of the silicon carrier nanosheet doped to form the second p-n junction. The device can also include a seed layer formed on the carrier nanosheet and the 2D material formed on the seed layer.

The device can include a first dielectric layer insulating the gate metal from the source contact and a second dielectric layer insulating the gate metal from the drain contact. The device can include at least one of the first p-n junction or the second p-n junction is formed to operate in a reverse bias and reduce leakage current flow through the carrier nanosheet.

The device can include a cavity formed in one or more layers of materials formed on a substrate and comprising a second channel formed above the channel. The device can comprise a second 2D material forming a second channel between the source and drain contacts and surrounding a second carrier nanosheet that forms a third p-n junction with the source contacts and the fourth p-n junction with the drain contact. The gate structure of the device can form a first ring around the channel and a second ring around the second channel and between the first and second p-n junctions.

The present disclosure may also relate to a method to fabricate a structure that includes one or more transistors. The method can include forming a source contact and a drain contact. A channel between the source and the drain contacts can be formed with a 2D material. The method can include surrounding, with the 2D material, a carrier nanosheet that forms a first p-n junction with the source contact and a second p-n junction with the drain contact. The method can include contacting, via a gate structure comprising a gate dielectric and a gate contact, at least a portion of the channel between the first p-n junction and the second p-n junction. The gate structure can form a gate all around structure surrounding the channel.

The method can include forming the source contact comprising a doped semiconductor material and a drain contact comprising the doped semiconductor material. The method can include forming the 2D material so as to form a channel that includes a first curved profile extending along the source contact and a second curved profile extending along the drain contact. A carrier nanosheet can be formed to comprise silicon.

The method can include forming a first portion of the carrier nanosheet comprising silicon doped to form the first p-n junction and forming a second portion of the carrier nanosheet comprising silicon doped to form the second p-n junction. The method can further include forming a seed layer on the carrier nanosheet and forming the 2D material on the seed layer.

The method can include forming a first dielectric layer insulating the gate metal from the source contact and a second dielectric layer insulating the gate metal from the drain contact. The method can also include forming at least one of the first p-n junction or the second p-n junction to operate in a reverse bias and reduce leakage current flow through the carrier nanosheet.

The method can include forming a cavity in one or more layers of materials formed on a substrate and forming a second channel formed above the channel. The method can include forming, with a second 2D material, a second channel between the sidewall surfaces of the source and drain contacts. The method can also include surrounding, with the second 2D material, a second carrier nanosheet. The method can further include forming, with the second channel, a third p-n junction with the source contacts and the fourth p-n junction with the drain contact. The method can also include forming, with the gate structure, a first ring around the channel and a second ring around the second channel and between the first and second p-n junctions.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIGS. 1, 2A, 2B, and 3-14 include cross-sectional, top-down and zoom-in views of an example core section of structure formed using a core flow approach and a series of fabrication steps for fabricating a 3D complimentary field-effect transistor ("CFET") structure that uses 2D material layers, silicon recessing, and silicon nanosheets, according to an embodiment.

FIGS. 15-20 include cross-sectional, top-down and zoom-in views of an example of fabrication steps and structures for completing a 3D CFET structure with 2D material layers and silicon recessing nanosheet, based on the core structure from FIG. 14, according to an embodiment.

FIGS. 22-29 include cross-sectional, top-down and zoom-in views of an alternative structure fabricated using fabrication steps for completing a 3D CFET structure with 2D material layers, silicon recessing and plasma doped silicon nanosheet, based on the structure from FIG. 14, according to an embodiment.

FIG. 30 includes cross-sectional and top-down views of an example of a modification to material stack for providing an alternative structure and fabrication steps via FIGS. 2A-14 and 22-29 to complete a 3D CFET structure using an alternative material stack, according to an embodiment.

DETAILED DESCRIPTION

Figure 1:
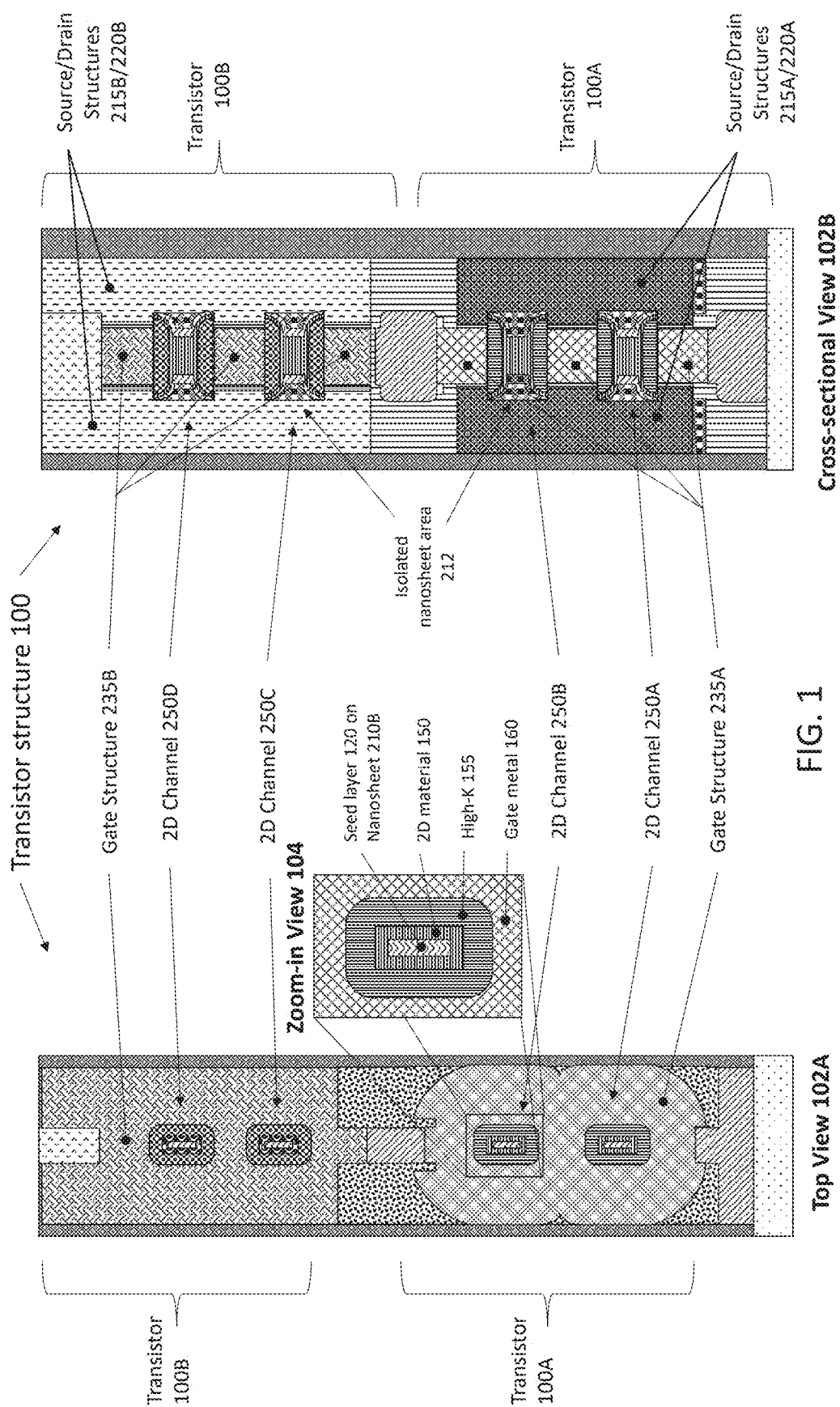

References will now be made to various illustrative embodiments depicted in the drawings, and specific language will be used to describe the same. It will nevertheless be understood that no limitation of the scope of the claims or this disclosure is thereby intended. Alterations and further modifications of the inventive features illustrated herein, and additional applications of the principles of the subject matter illustrated herein, which would be apparent to one of ordinary skill in the relevant art having possession of this disclosure, are to be considered within the scope of the subject matter disclosed herein. Other embodiments may be used and/or other changes may be made without departing from the scope of the present disclosure. The illustrative embodiments described in the detailed description are not meant to be limiting of the subject matter presented.

It is understood that apparatuses, systems and devices produced by the structures described herein can be used or find their application in any number of electronic devices utilizing structures and/or circuits described herein, such as controllers, memory chips, systems or process on a chip processors, graphics processing units, central processing units, and more. For example, structures, and/or circuits described herein can include a part of systems utilizing memory, such as any computing systems including, for example: computers, phones, servers, cloud computing devices, and any other device or system that utilizes integrated circuit devices.

The embodiments described herein may enable an increased stack height of one or more 3D semiconductor devices. Therefore, a semiconductor substrate can be used, but is not required, and any base layer material (e.g., glass, organic, etc.) may be used instead of a traditional silicon substrate. A base layer, therefore, can be a semiconductor substrate, such as a silicon substrate. Some embodiments include 3D stacks of vertical conductive channel nanosheets in both CFET and side-by-side configurations.

The process flows described herein utilize semiconductor oxide materials to form NMOS and PMOS devices. As such, the techniques described herein can be used to produce devices that are manufactured, or "stacked" on any existing vertically stacked device or substrate, according to various implementations. The present techniques may improve upon other semiconductor manufacturing techniques by increasing the N height of stacked semiconductor devices, such as transistors, thereby providing high density logic. Although illustrations herein may show an NMOS device arranged over a PMOS device, alternative configurations may include a PMOS device over NMOS device, NMOS device over NMOS device, PMOS device over PMOS device, or other alternative including one or more NMOS devices or PMOS devices for any number of N stacks and in any order or arrangement.

Dielectric materials used herein can be any material or materials having low electrical conductivity, such as one millionth of a mho/cm. Dielectric materials can include, for example, silicon dioxide, silicon nitride, nanoporous silica, hydrogensilsesquioxanes (HSQ), Teflon-AF (Polytetrafuoethene or PTFE), Silicon Oxyflouride. Dielectric materials can also include, for example, ceramics, glass, mica, organic, and oxides of various metals.

High-k dielectric, also referred to as high-k material, can refer to any material with a higher dielectric constant as compared to the silicon dioxide. For example, high-k dielectric can include hafnium silicate, zirconium silicate, hafnium dioxide, zirconium dioxide, and others.

Various metals, such as gate metal and the source/drain metal, can be used herein and can include any metal or any electrically conductive material. For example metals used in the present solution can include aluminum, copper, titanium, tungsten, silver, gold, or any other metal. For the purposes of the present solution, in addition to the metals, source/drain metals or gate metals can also include other electrically conductive materials, such as highly doped semiconductors, for example.

The present solution can also utilize 2D materials for forming transistor channels. 2D materials can include, for example, but are not limited to, WS2, WSe2, WTe2, MoS2, MoSe2, MoTe2, HfS2, ZrS2, and TiS2, GaSe, InSe, phosphorene, and other similar materials. These materials can be deposited by an atomic layer deposition (ALD) process and may be about 5-15 angstroms thick, the thinness lending to their name-2D material. 2D material layer can, depending on the material and design, and can have a broader range of thicknesses, such as between 0.2 nm and 3 nm, for example. 2D materials may be annealed during or after the device formation process to recrystallize or grow the crystals and thereby improve electrical characteristics. 2D materials, for example, can be electrically conductive.

Additionally or alternatively, 2D materials to be used for forming 2D channels may comprise one or more semiconductive-behaving materials, which may be formed using certain elements that, when combined with oxygen, form a new material that exhibits semiconductive behavior. For example, the semiconductive behaving material (e.g., semiconductive oxide) can be "turned off" and can have a low or practically no off-state leakage current, and can be "turned on" and become highly conductive when voltage is applied. Example materials to create an n-type channel for example include, but are not limited to, In2O3, SnO2, In GaZnO, and ZnO. Example materials that can be used to create a p-type channel may be formed utilizing, for example, SnO. These materials may be further doped to improve the electrical characteristics. These materials may also be referred to as conductive oxides or semiconductive behaving oxides for the purposes of this discussion.

As 2D materials can have a very large mobility, the 2D materials can be herein described as one embodiment. However, it is to be appreciated that other non-epitaxially grown materials can be utilized. Since a 2D material can be precisely deposited on an insulative sheet, this deposition can enable a very low Dt integration build of horizontal nanosheets with high performance. Advantageously, any base substrate material can be utilized as no epitaxial growth is required and the base substrate can be removed for further stacking of the devices.

Carrier nanosheets can be used to provide support for the 2D material layers. Carrier nanosheets can include dielectric materials or semiconductor materials on which 2D material layer, such as a monolayer of 2D material, can be deposited, grown, or otherwise formed. Carrier nanosheets can include an electrically insulating material that can be used as a seed layer for the 2D material(s) used in the stack. Additionally or alternatively, a seed layer can include a material that can be deposited onto a carrier nanosheet onto which a layer of 2D material can be formed, deposited, or applied.

Reference will now be made to the Figures, which for the convenience of visualizing the 3D semiconductor fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative and are intended to show a capability for providing such connections, and they should not be considered limiting to the scope of the claims. Conversely, when example illustrations do not show electrical connections to components that are electrically contacted, it is understood that such electrical connections can be made as understood by a person of ordinary skill.

Although the Figures and aspects of the disclosure may show or describe devices herein as having a particular shape, it should be understood that such shapes, whether of the structures or features, are used as examples of the present solution and are merely illustrative and should not be considered limiting to the scope of the techniques described herein. For example, although most of the Figures show various layers in a rectangular shaped configuration, other shapes are also contemplated, and indeed the techniques described herein may be implemented in any shape or geometry. In addition, examples in which two transistors or devices are shown stacked on top of one another are shown for illustrative purposes only, and for the purposes of simplicity. Indeed, the techniques described herein may provide for one to any number N stacked devices. Likewise, the techniques described herein may provide for one to any number N nanosheets and 2D material channels stacked in a transistor or another device. Further, although the devices fabricated using these techniques are shown as transistors, it should be understood that any type of electric electronic device may be manufactured using such techniques, including but not limited to transistors, variable resistors, resistors, capacitors, memory components, logic gates and components, and any other components known or used in the art.

Despite the fact that illustrated embodiments for simplicity and brevity show examples of only a single or double transistor structures being formed using the techniques of the present solution, any number of transistors can be formed above and beside the transistor structures illustrated in examples illustrated, such as may be desired for forming a 3D array of devices.

The structures and methods described herein can utilize a nanosheet based design to fabricate transistors that use 2D material layers as transistor channels along with epitaxially doped regions or metals that can be formed or grown for the transistor source/drain contacts. It is understood that alternatively or additionally, metal contacts or epitaxially doped regions for source and drain contacts can be used, depending on the implementation. Likewise, deposition fill and CMP techniques can be used for fabricating source/drain contacts.

The structures and methods described herein can further use a seed layer, which can be formed or grown on a silicon nanosheet to allow for a selective 2D material deposition on top of the seed layer that sits on the silicon nanosheet. Recessing silicon at the junction of source/drain can be used to reduce the current leakage through the silicon nanosheet, thus making the 2D material acting as the only path (i.e., channel) between the source and the drain, minimizing leakage currents. Oxidizing silicon at the junction of source and drain can also be used to reduce the current leakage through the silicon nanosheet, thereby also making 2D material acting as the only path (i.e., channel) between the source and drain. It is understood that the same or similar steps can be performed with any number of other materials, including any semiconductor materials known or used.

The structures and methods described herein can further utilize plasma doped silicon nanosheets and/or epitaxially grown doped silicon nanosheets, to reduce leakage current at the channel of the transistor structure. Using these techniques, one or more diode structures can be formed at both ends of the source/drain contacts and doped silicon nanosheet. The one or more diode structures can be formed in an inverse bias with respect to the silicon nanosheet, thereby making the diode structures highly resistive to leakage currents from the source and drain contacts. These diode structures can in turn help ensure that the 2D material is the only path (i.e., the channel) between the source and drain.

Described in the Figures below is one or more structures along with one or more methods of fabricating 3D transistor structures that utilize one or more 2D material channels on carrier nanosheets. The following Figures present the solution in which 3D transistors can utilize 2D material channels that can be formed using any number of techniques, such as mechanical exfoliation (ME), chemical vapor deposition (CVD), atomic layer deposition (ALD), and/or sputtering.

Referring now to FIG. 1, a top view 102A, a cross-sectional view 102B, and a zoom-in view 104 of an example transistor structure 100 of the present solution are illustrated. The transistor structure 100, which can also be referred to as a structure 100, may include a transistor 100A and a transistor 100B, although depending on the implementation, any number of transistors 100A-N can be fabricated. Each of the transistors 100A and 100B may include one or more 2D channels 250, which can also be referred to as channels 250. In the illustrated example, transistors 100A and 100B each include two channels 250, such that transistor 100A includes a 2D channel 250A and a 2D channel 250B, while transistor 100B includes a 2D channel 250C and a 2D channel 250D.

FIG. 1 also shows the transistor structure 100 including gate structures 235. Specifically, transistor 100A includes a gate structure 235A and transistor 100B includes gate structure 235B. While gate structures 235A and 235B are illustrated as gate all around ("GAA") structures that entirely encircle or surround 2D channels 250. It is understood that gate structures 235A and 235B can be formed as other types of gate structures 235, including those that interface with only a single surface of the 2D channel 250 or only partially surround 2D channel 250. Specifically, in the illustrated example, gate structure 235A entirely surrounds or encircles channels 250A and 250B and GAA gate structures 235B entirely surrounds or encircles channels 250C and 250D.

All four channels 250A-D of the transistor structure 100 in FIG. 1 can be formed so as to be vertically aligned with each other. Specifically, in the example structure 100, channel 250A is formed at the lower end of the structure 100, just above the substrate, while channel 250B is formed above channel 250A, channel 250C is formed above channel 250B, and the channel 250D is formed above channel 250C, as the topmost channel 250 of the structure 100. Likewise, in the illustrated example, gate structure 235A is formed at the lower end of the structure 100 and gate structure 235B is vertically aligned with and formed above gate structure 235A at the upper end of structure 100. In some implementations gate structures 235A and 235B are electrically isolated from each other, thereby allowing for independent operation of the gate structures 235A and 235B, while in other implementations gate structures 235A and 235B can be electrically shorted and operated together as one gate structure 235.

Transistors 100A and 100B of FIG. 1 can also include their own source and drain contacts or structures. Specifically, transistor 100A includes a first source/drain ("S/D") structure 215A and second S/D structure 220A. Likewise, transistor 100B includes its own first S/D structure 215B and second S/D structure 220B. S/D structures 215A and 220A can be electrically isolated from each other, so that transistors 100A and 100B can be operated independently. In some implementations, S/D structures 215A and 215B and S/D structures 220A and 220B are electrically shorted to each other, so that they can be operated together. When S/D structures 215 and 220 and gate structures 235 from transistor 100A are electrically shorted with their counterparts in transistor 100B, the structure 100 can operate as a single transistor with four 2D channels 250A-D, allowing for an improved transistor performance depending on the implementation.

Also shown in the example in FIG. 1, each of the 2D channels 250 can include several components. For example, in zoom-in view 104 showing a close-up of a 2D channel 250B, the 2D channel 250B includes a nanosheet 210B that is covered or surrounded by a seed layer 120. On top of the seed layer 120 is a layer of 2D material 150 covering the exposed areas of the seed layer 120. The nanosheet 210B, coated by the seed layer 120 and further surrounded by 2D material 150, can be spanned between the first S/D structure 215A and the second S/D structure 220A, thus forming the 2D channel 250B. Channels 250A, 250C and 250D can be similarly structured and formed.

Shown, for example, in FIGS. 2A-14, an embodiment of a core flow approach is illustrated that provides a series of fabrication steps that can be used by one or more designs to manufacture a 3D CFET structure 100 using 2D material, silicon recessing, and plasma doped silicon nanosheets. The core flow approach can utilize 2D material layers to form transistor channels 250 using nanosheets 210 and seed layers 120, and can also use metal filled or epitaxial doped regions grown for source/drain contacts 215 and 220. The structure 100 can use recess etching of a silicon nanosheet 210 to open access for channel 250 to improve the contact of the channel 250 with the source/drain 215 and 220 contacts.

In FIG. 2A, a top view 200A and a cross-sectional view 202A are illustrated in which a layered stack of materials on a silicon substrate 101a is shown. On top of the silicon substrate 101a, a material stack can be formed in which several layers of materials can be formed, one on top of another. The stacked materials can each be epitaxially grown or deposited using any other way known or used in the industry. The material layers can further include one or more sacrificial layers that can be removed during the process.

Cross-sectional view 102 of the FIG. 2A illustrates an example implementation in which the material stack can include the following arrangement of material layers, where the layers are stacked on top of Silicon substrate 101a in the following order: on a substrate 101a, a first layer of SiGe 115 is formed, on top of which is a first layer of SiGe 116, on top of which is a first layer of silicon 101, on top of which is a second layer of SiGe 116, on top of which is a second layer of silicon 101, on top of which is a third layer of SiGe 116, on top of which is a second layer of SiGe 115, on top of which is a fourth layer of SiGe 116, on top of which is a third layer of Silicon 101, on top of which is a fifth layer of SiGe 116, on top of which is a fourth layer of Silicon 101, on top of which is a sixth layer of SiGe 116, on top of which is a dielectric 125. Dielectric 125 can remain the top layer and act as a hard mask protecting the material stack during upcoming fabrication steps.

In FIG. 2B, a top view 200B and a cross-sectional view 202B are illustrated in which a nanosheet mask can be used to directionally downward etch all of the layers on top of the silicon substrate 101a with the stop at the silicon substrate 101a (e.g., the bottom layer illustrated in FIG. 2B). The resulting structure can include a column of material layers whose cross-section can be in the shape of the mask shown in the top view 200B. While the illustrated embodiment in top view 200B shows a rectangular shape of the mask, resulting in the rectangular shaped cross-section of the material stack, any other shaped cross-section can be used instead, including circular, oval, elliptical, square, hexagonal, octagonal, any polygonal shape, or any other shape known or used.

Once the directional etch in FIG. 2B is complete, the region surrounding the column of material can be deposit filled with dielectric 105. Following the dielectric 105 filling, a chemical mechanical polishing ("CMP") procedure can be implemented to clear out any excess material, leaving the top surface of the material stack cleared and even with the dielectric 125 on top of the material stack.

Figure 3:
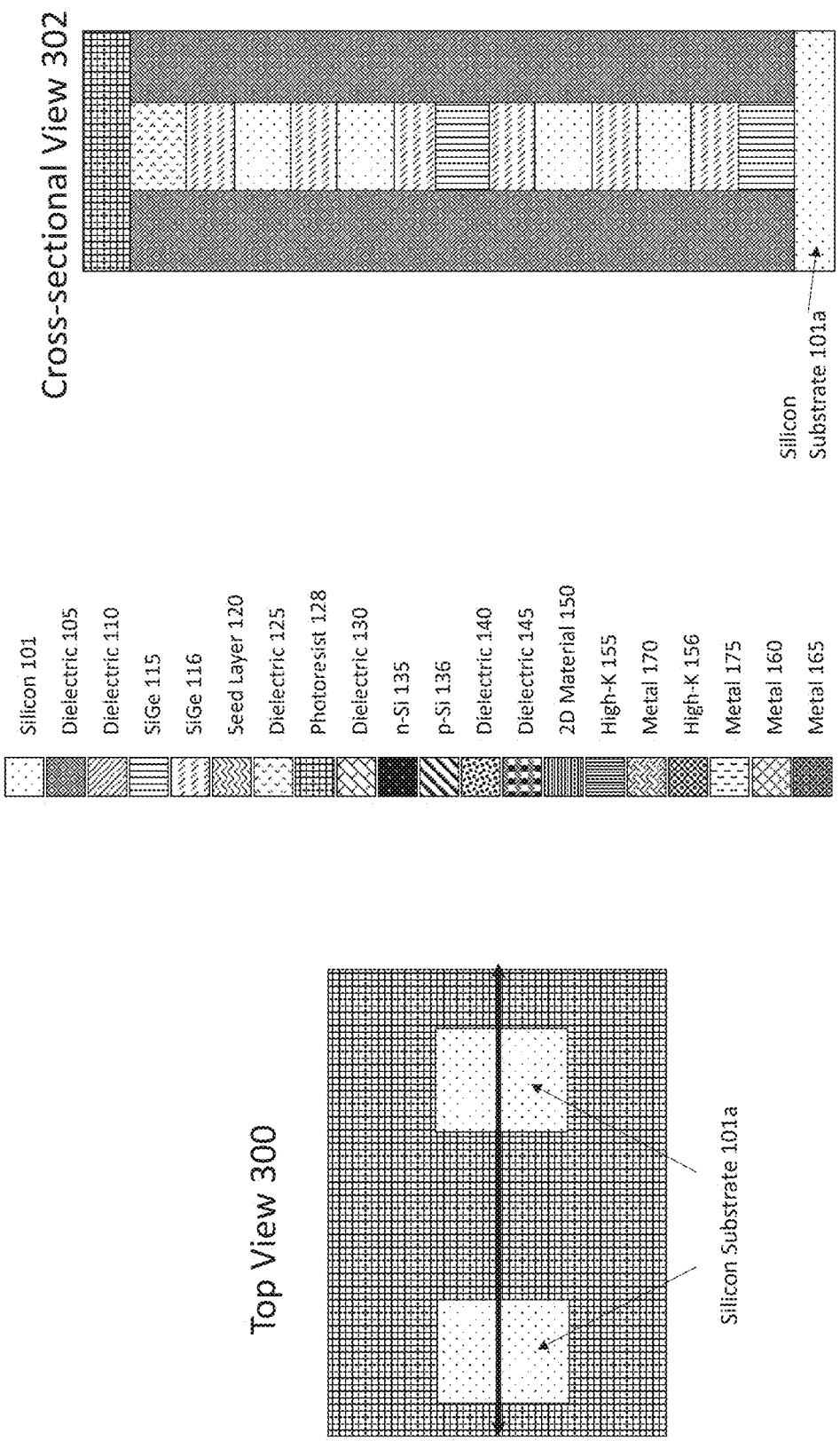

In FIG. 3, a top view 300 and a cross-sectional view 302 are illustrated in which a layer of photoresist 128 is applied on the top surface of the material stack, after which a nanosheet source/drain mask can be used for directional downward etching of dielectric 105 along the two distal ends of the material stack in which source and drain regions will be formed. The etching step can be implemented for the entire thickness of the material stack and continue until the substrate 101a is reached.

Figure 4:
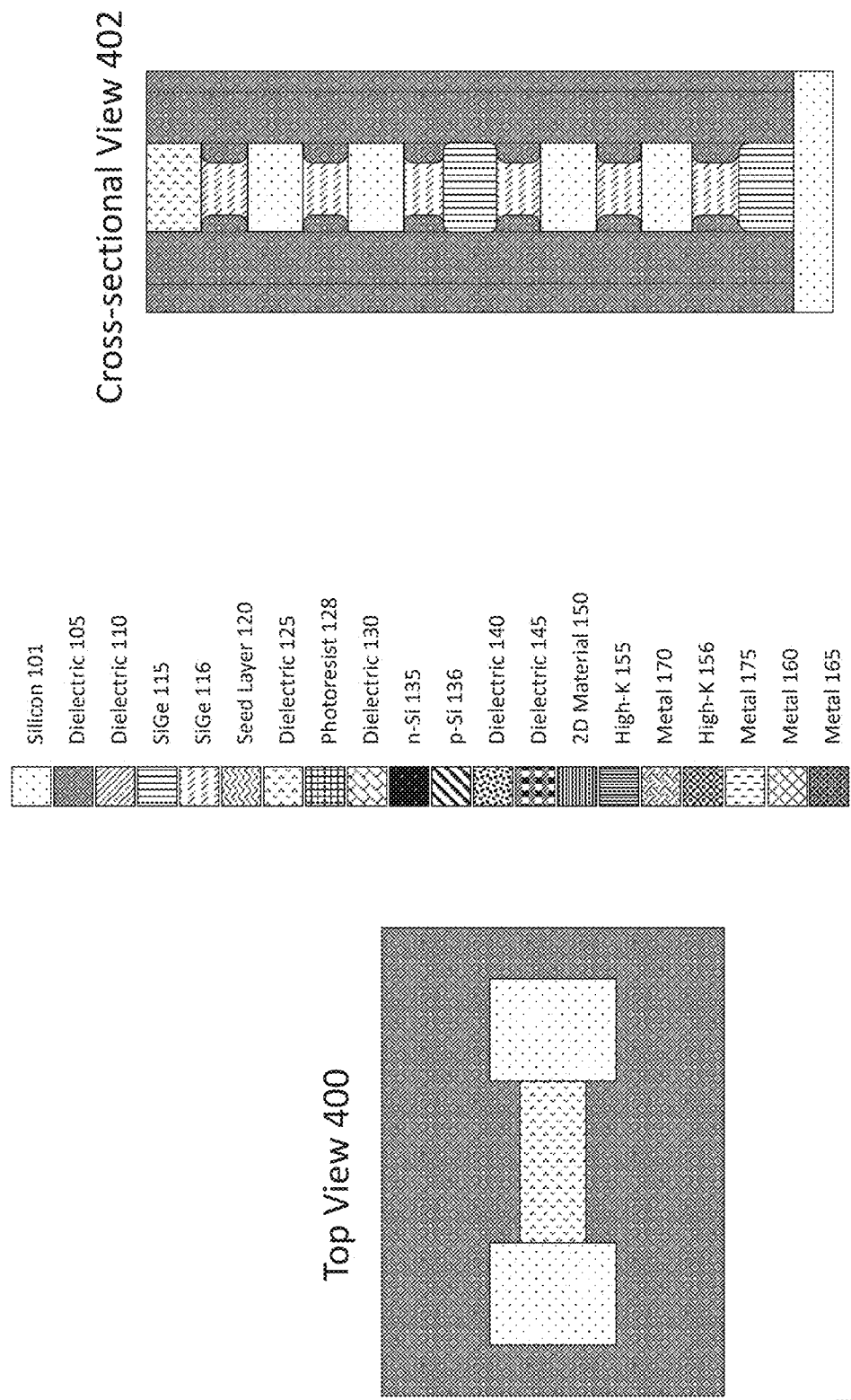

In FIG. 4, a top view 400 and a cross-sectional view 402 are illustrated in which, after stripping off the photoresist 128, a recess etch of SiGe 116 can be performed. By recess etching the sides of the SiGe 116 layers in the structure, a space can be provided for electrical isolation between the source/drain contacts and the gate metal to be completed in the later fabrication steps.

In FIG. 5, a top view 500 and a cross-sectional view 502 are illustrated in which source and drain regions etched out in the fabrication steps discussed in connection with FIG. 3 are deposit filled with dielectric 130. Dielectric 130 filling can provide the isolation to the structure from the Silicon substrate 101a and any other potential surrounding structures. Dielectric 130 can also provide electrical isolation between S/D contacts or structures 215 and 220 and the gate structures or contacts 235 gate to be completed in the upcoming steps.

Figure 6:
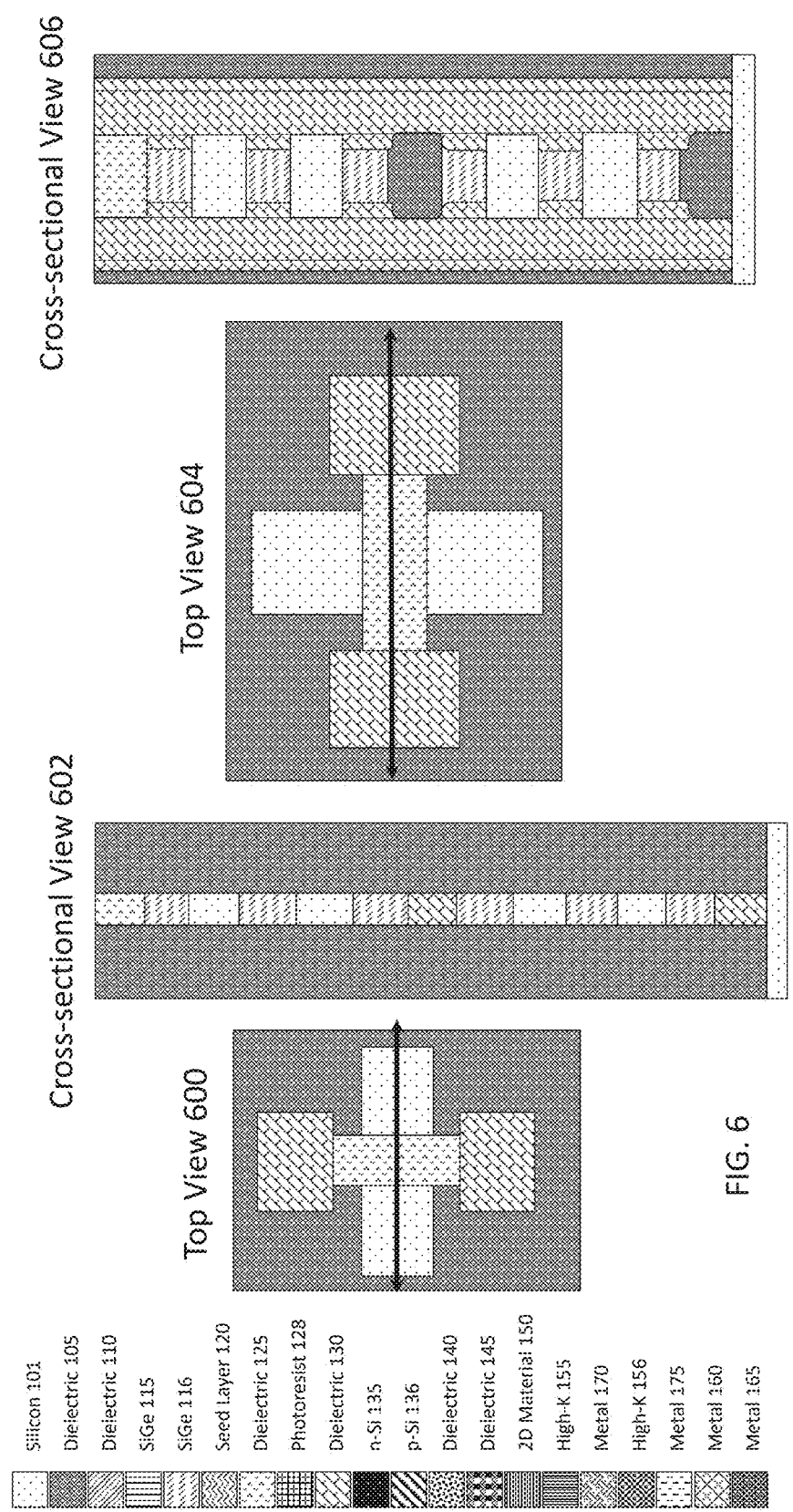

In FIG. 6, a top view 600, a cross-sectional view 602, a top view 604 and a cross-sectional view 606 are illustrated in which a nanosheet gate mask along with photoresist 128 (not shown) can be used to directionally etch dielectric 105. The etching can be performed along the direction as shown in the cross-sectional view 602, and can be implemented using the same or similar techniques as those discussed in connection with FIG. 3.

After stripping off the photoresist 128, SiGe 115 can be selectively etched out from the material stack. Selective etching out of SiGe 115 can be implemented through cavities etched out and shown in cross-sectional view 602 to get in contact with the SiGe 115 layers more clearly shown in cross-sectional view 606. Upon completion of this step, SiGe 115 regions can be empty. The emptied out SiGe 115 regions is shown in cross-sectional view 606 as comprising dielectric 105, but this can refer to the material present behind the illustrated cross-section.

Figure 7:
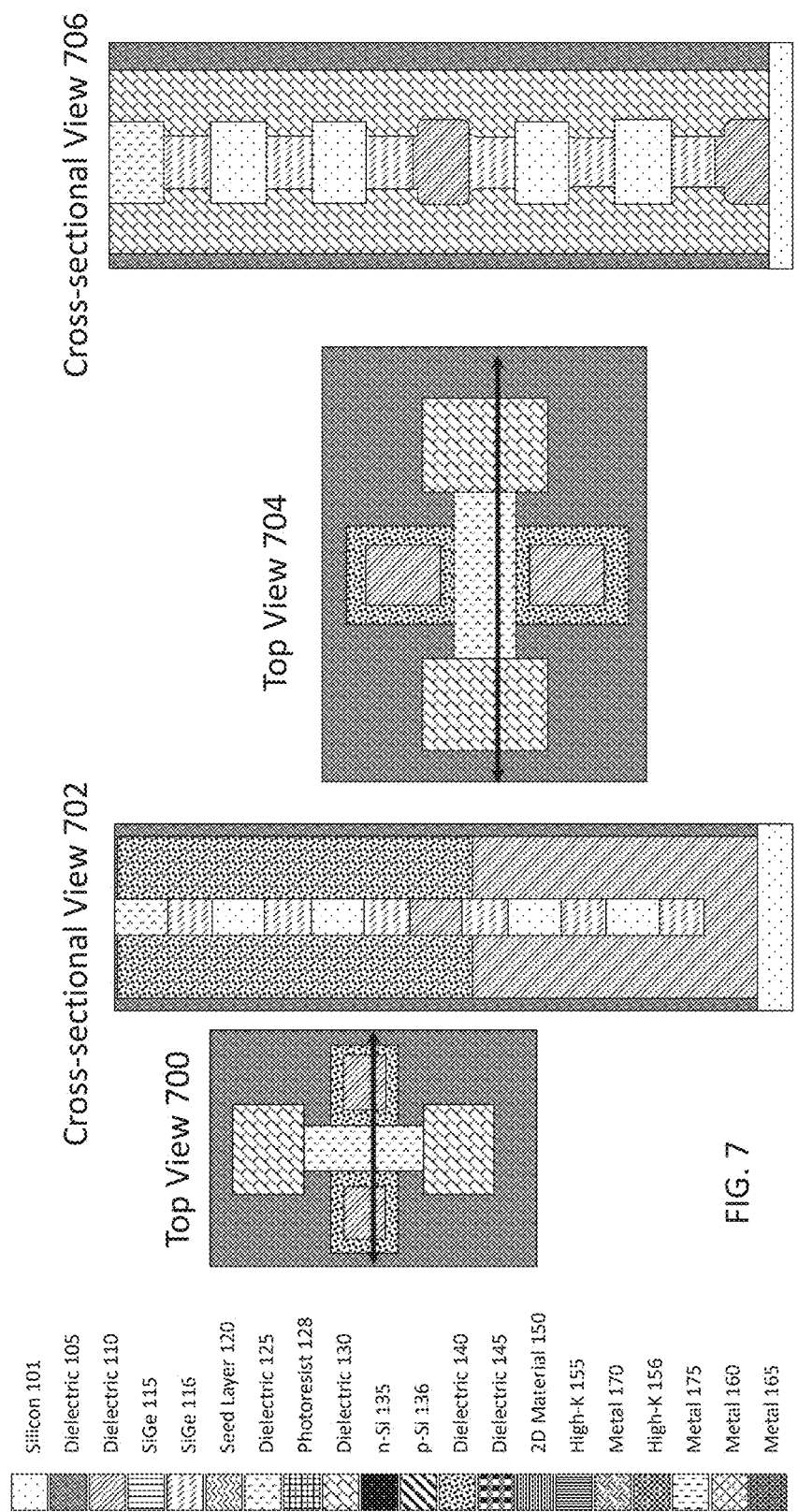

In FIG. 7, a top view 700, a cross-sectional view 702, a top view 704 and a cross-sectional view 706 are illustrated in which deposit fill by dielectric 110 can be implemented. A CMP can be performed to smooth out the top surface. As visible in cross-sectional view 702, after the dielectric 110 fill and the CMP, a downward directional etch can be performed up through the top part of the dielectric 110 until about the middle part of the structure. This can leave the top part of the structure empty and dielectric 140 can be ALD deposited to fill the void. As shown in cross-sectional view 702, the bottom part of the structure can be filled with dielectric 110 and the top part of the structure can be filled with dielectric 140.

Figure 8:
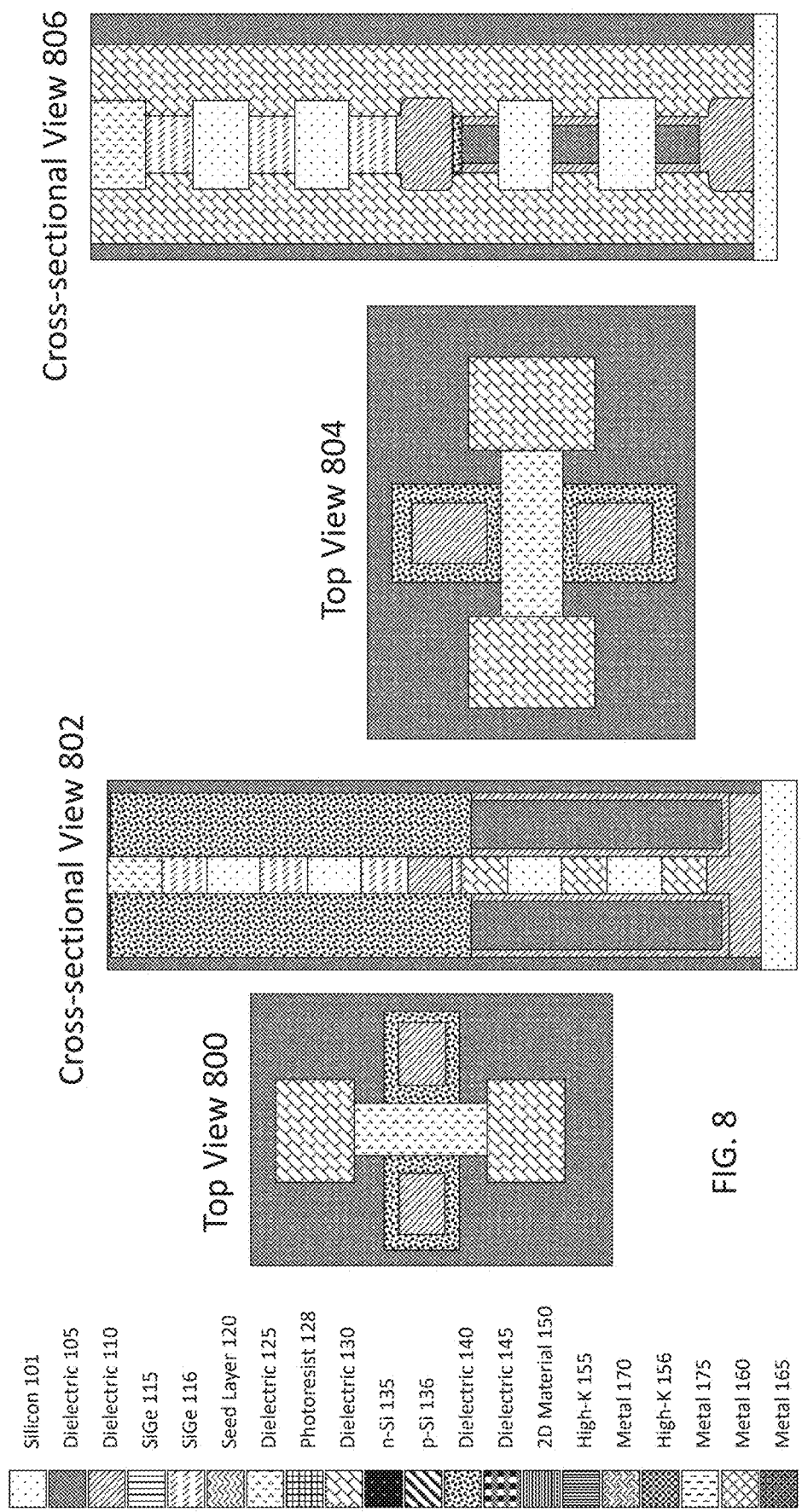

In FIG. 8, a top view 800, a cross-sectional view 802, a top view 804 and a cross-sectional view 806 are illustrated in which dielectric 110 is directionally downward etched to enable selective etching of the three lower SiGe 116 layers. The etching of the dielectric 110 can be completed to reach the silicon substrate 101a. In some implementations, the downward etching is completed from the top of the dielectric 110 to below the layer of the lowest SiGe 116 layer.

As shown in cross-sectional view 806, once dielectric 110 is etched out, the lower three SiGe 116 layers can each be exposed for etching to make the space for a gate structure 235A to be completed therein. This can be performed via one or more hollow trenches or access points (not shown) that can be formed through the dielectric 140 to reach the dielectric 110 at the lower section of the structure (e.g., the transistor 100A area). Meanwhile, the dielectric 140 in the top portion of the structure (e.g., transistor 100B area) can remain intact protecting the top three SiGe 116 layers from etching, thus allowing only the bottom three SiGe 116 layers to be etched out selectively at this stage.

Figure 9:
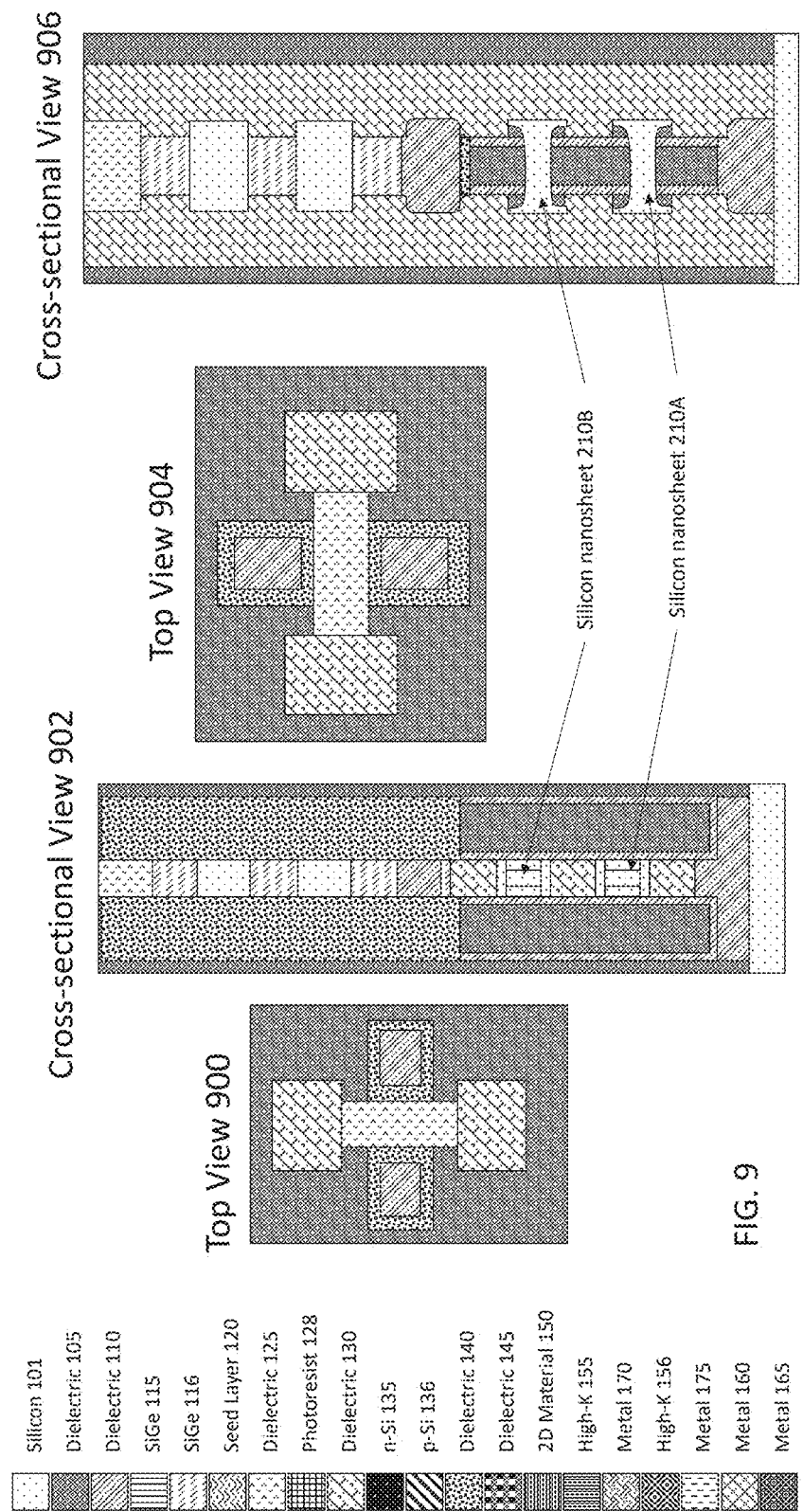

In FIG. 9, a top view 900, a cross-sectional view 902, a top view 904 and a cross-sectional view 906 are illustrated in which silicon nanosheet 210, also referred to as the carrier nanosheet 210 or nanosheet 210, can be formed by recessing exposed silicon 101 layers. The recessing can be performed isotropically so as to form a curved top and bottom portions. The edges of the nanosheets 210 that are protected by the dielectric 130, such as shown in cross-sectional view 906, can be left unetched. As this etch can be performed selectively on only the exposed silicon 101 material surfaces, while edges abutting dielectric 130 remain unetched, the resulting structure of the nanosheets 210 can have a spider-like shape due to the available area of the contact to the wet etchant.

As shown in cross-sectional view 906, after performing the etch in this fabrication step, the transistor structure 100 can include a silicon nanosheet 210A formed out of the first silicon 101 layer and a silicon nanosheet 210B formed out of the second silicon 101 layer. Nanosheets 210 and 210B can be spider shaped, such as having a concave shaped top and bottom surfaces. The top surface of the nanosheet 210 can curve inward to form a concave up shape, whereas the bottom surface can also curve inward to form a concave down on that surface. Nanosheets 210A and 210B can be formed one on top of the other, so as to be vertically aligned with each other. Nanosheets 210A-B can also be spaced apart from each other by the thickness of the SiGe 116 layer between them that was removed in connection with the fabrication steps discussed in FIG. 8.

Figure 10:
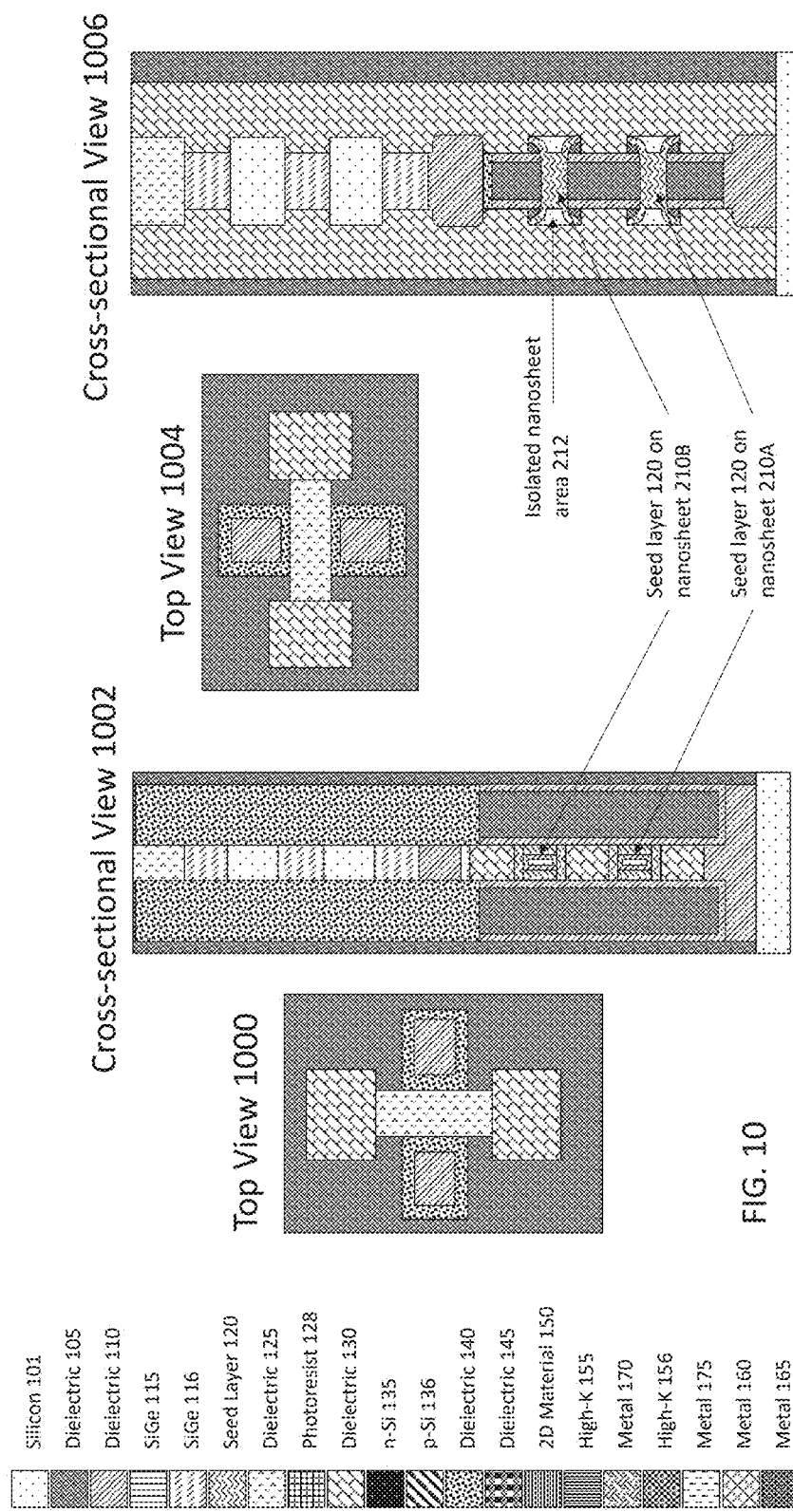

In FIG. 10, a top view 1000, a cross-sectional view 1002, a top view 1004 and a cross-sectional view 1006 are illustrated showing illustrative steps in which the seed layer 120 can be formed on the nanosheets 210. The seed layer 120 can include, for example, SiO2 material, although it is not limited to SiO2, as those skilled in the art understand that other materials can be used, depending on the choice of the suitable 2D material 150 to use for the channels 250. In some embodiments, the seed layer 120 (e.g., the SiO2 material layer) can be grown on the surface of the silicon 101 layers from which the silicon nanosheets 210 are formed. SiO2, or any other seed layer 120, can be grown or deposited selectively on silicon nanosheet 210 to provide the platform for the 2D material 150 to be deposited thereon. As shown in cross-sectional views 1002 and 1006, the seed layer 120 can be deposited, grown, or otherwise formed on the outer surfaces of the nanosheets 210A and 210B.

Also shown in the cross-sectional view 1006, nanosheets 210 (e.g., 210A, 210B or any other discussed herein) can have a surface that is protected by dielectric 130 and onto which the seed layer 120 is not applied because of the dielectric 130 covering that surface. The portion of the nanosheet 210 within the material that is covered by dielectric 130 can include a leakage area 212, comprising carrier nanosheet 210 native material (e.g., silicon 101, in the illustrated example). Leakage area 212 can be protected from the seed layer 120 and therefore include no seed layer 120. Due to the prior etching steps of the silicon 101, the leakage area 212 can have a cross-section that is curved, such as being flare-shaped or cone-shaped, as shown in the cross-sectional view 1006. The curved cross-section can have a wider bottom area facing the surface that interfaces or is in contact with the dielectric 130, whereas the narrower area of the cone or flare can point inwards to the interior volume of the carrier nanosheet 210. The leakage area 212 can have a volume that is shaped as a cone with its bottom (e.g., wider) cross-section shaped as a rectangle facing the dielectric 130 in the cross-sectional view 1006 and a top portion facing the interior of the nanosheet 210. The top of the cone or flare shaped leakage area 212 can include a frustum at the top (e.g., the top of the cone or flare is flattened or cut off), such as illustrated in cross-sectional view 1006. The leakage area 212 can be included on each side of the channel 250, as can be also seen in connection with FIGS. 17, 18, 24, 25 and 26.

Figure 11:
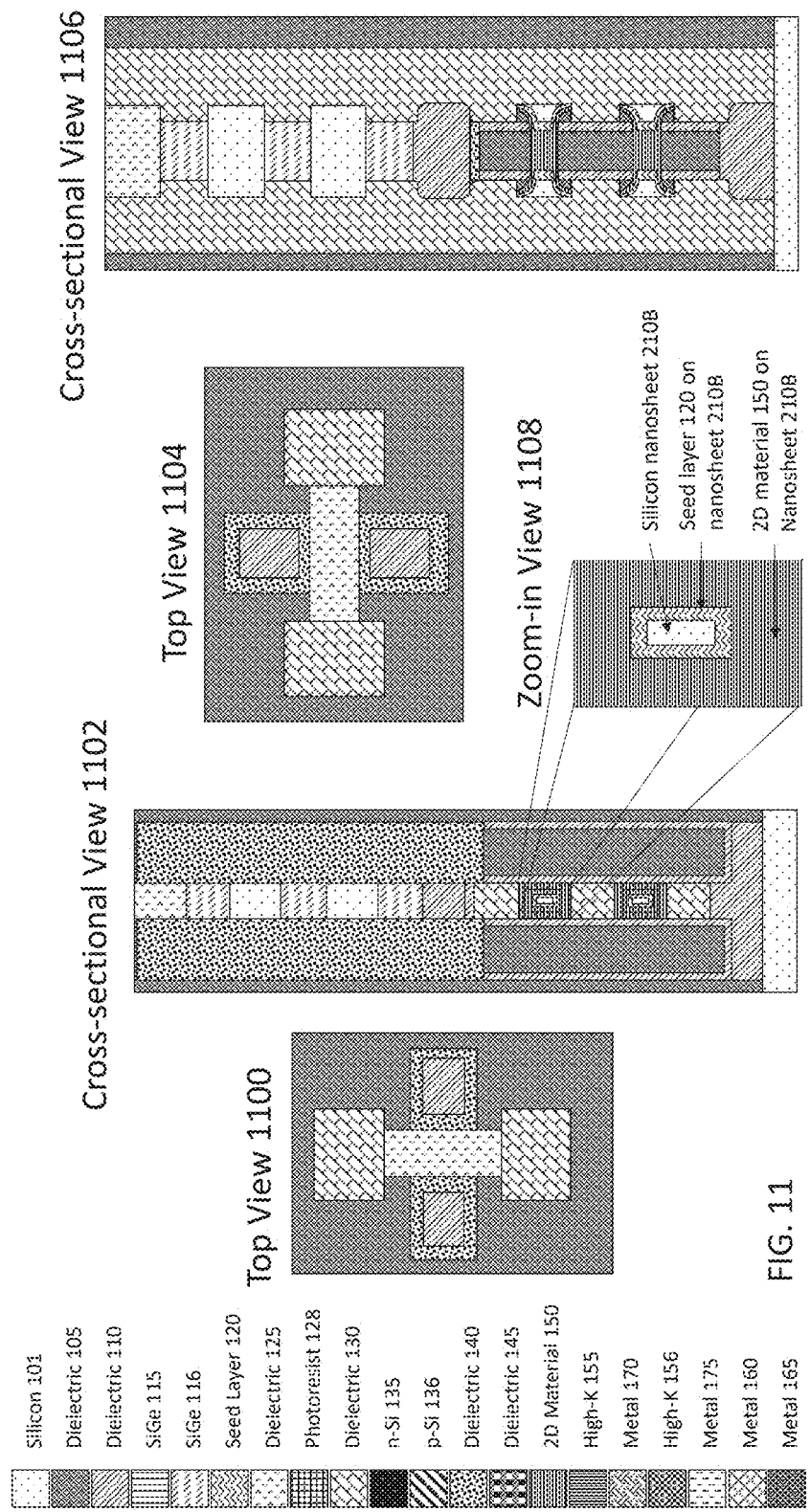

In FIG. 11, a top view 1100, a cross-sectional view 1102, a top view 1104, a cross-sectional view 1106, and zoom-in view 1108 are illustrated in which seed layer 120 (e.g., SiO2 or other suitable material) can be recess etched slightly to make sure the source and drain regions are wide open for channel layer deposition. Following the slight recess etch of the seed layer 120, 2D material 150 can be selectively deposited onto the outer surface of the seed layer 120. 2D material 150 can be a material forming a monolayer of molecules on top of the seed layer 120, covering any exposed area of the seed layer 120.

As shown, for example in the zoom-in view 1108 of the cross-sectional view 1102 of the silicon nanosheet 210B and its structure, in the example structure 100, the silicon nanosheet 210 is surrounded by a seed layer 120, which is then further surrounded by 2D material 150. As 2D material 150 can include a monolayer, the illustration showing greater thickness of the 2D material 150 with respect to the nanosheet 210 and the seed layer 120 can be due to the flared or conical shape of the leakage area 212 on the carrier nanosheet 210B as opposed to the thickness of the actual material. Depending on the implementations, any one of the seed layer 120 or 2D material 150 can be formed on only a portion of a surface and can partially surround the nanosheet 210.

Figure 12:
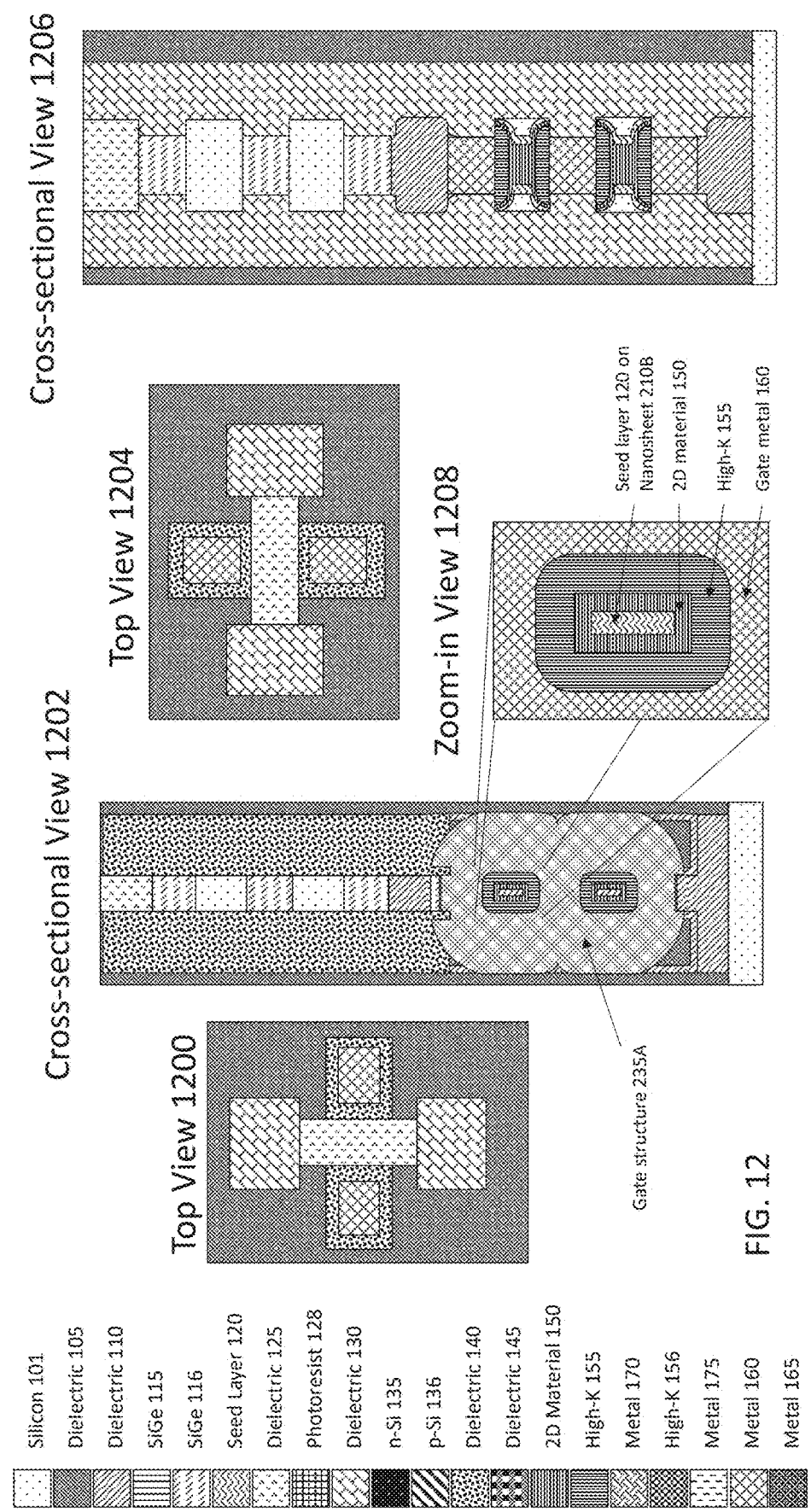

In FIG. 12, a top view 1200, a cross-sectional view 1202, a top view 1204, a cross-sectional view 1206 and zoom-in view 1208 are illustrated in which gate structure 235 can be formed. The gate structure 235A can include high-k 155 material and gate metal 160. A layer of high-k 155 dielectric can be formed or otherwise applied to 2D material 150. High-k 155 can be selectively deposited onto exposed 2D material 150, electrically insulating the 2D material 150 from gate metal 160 of the gate structure 235A. High-k 155 can partially or fully surround or envelop 2D material 150.

Gate metal 160 can then be deposited on top of the high-k 155 material, partially or fully surrounding or enveloping the high-k 155.

As shown, for example, in the zoom-in view 1208 of 2D channel 250B of the transistor 100B of the structure, the gate structure 235 of the transistor 100B can be a gate all around ("GAA") structure in which the 2D channel 250B of the transistor 100B and the 2D channels 250A of the transistor 100A are fully surrounded by the high-k 155 and gate metal 160 of the gate structure 235. The gate metal 160 of the gate structure 235A can entirely surround or form a ring around each one of the 2D channel 250A and 2D channel 250B with a single metal structure. Therefore, gate structure 235A can include two interconnected metal rings, each one encircling or surrounding a channel of the channels 250. In some implementations, due to its rings around channels 250 the gate structure 235A can be shaped like a number 8.

Figure 13:
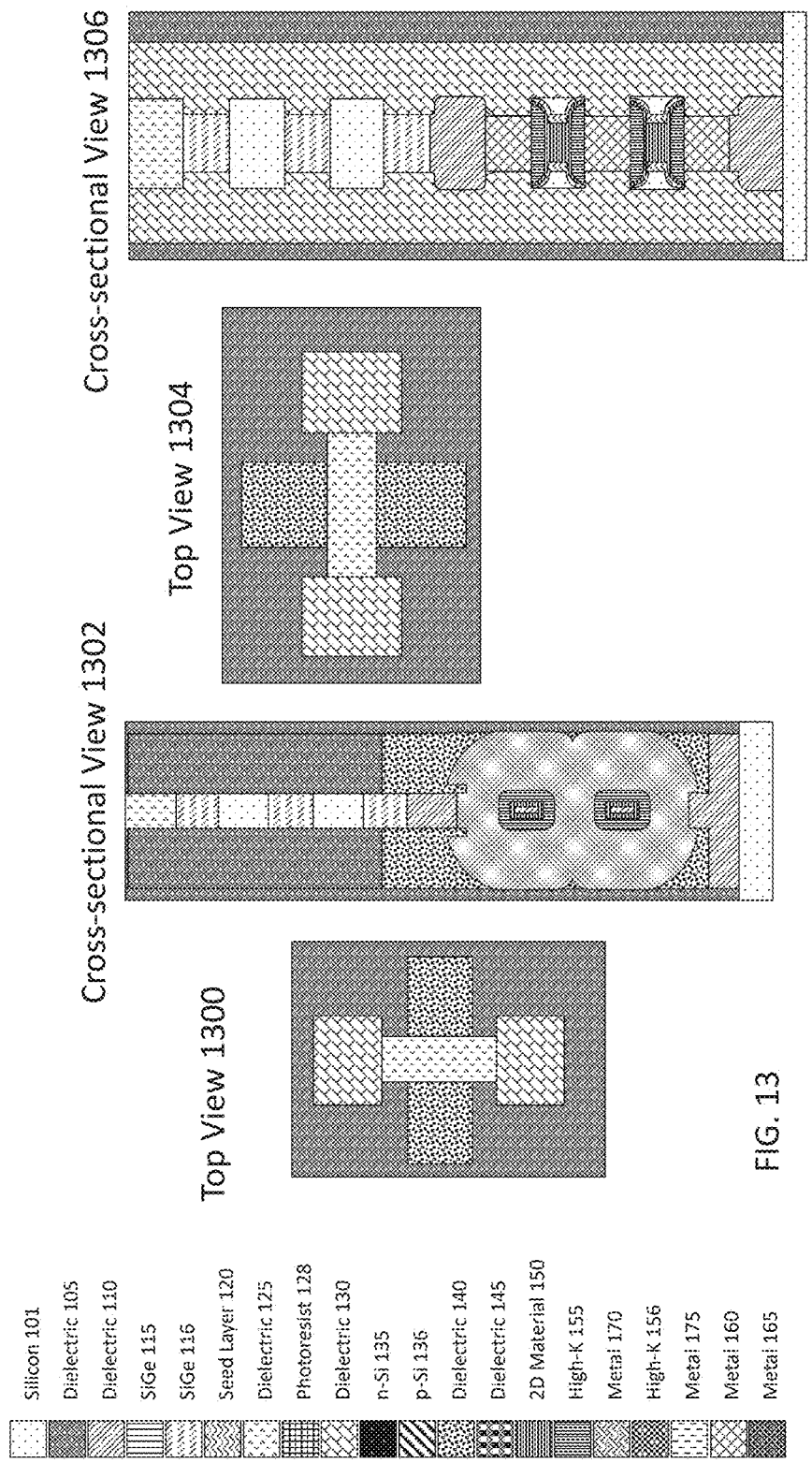

In FIG. 13, a top view 1300, a cross-sectional view 1302, a top view 1304 and a cross-sectional view 1306 are illustrated showing dielectric 140 being deposit filled around the gate structure 235. Dielectric 140 can provide electrical isolation for the gate structure 235A and the gate structure 235B to be completed in the upcoming steps. Once dielectric 140 is deposited, a CMP can be performed to clear out the surplus material from the top surface of the structure 100. Then, the upper part of the dielectric 140 (e.g., in the transistor 100B area) can be etched back, thereby leaving only the dielectric 140 filling in the area surrounding the gate structure 235A, while leaving the area for the transistor 100B not filled.

Figure 14:
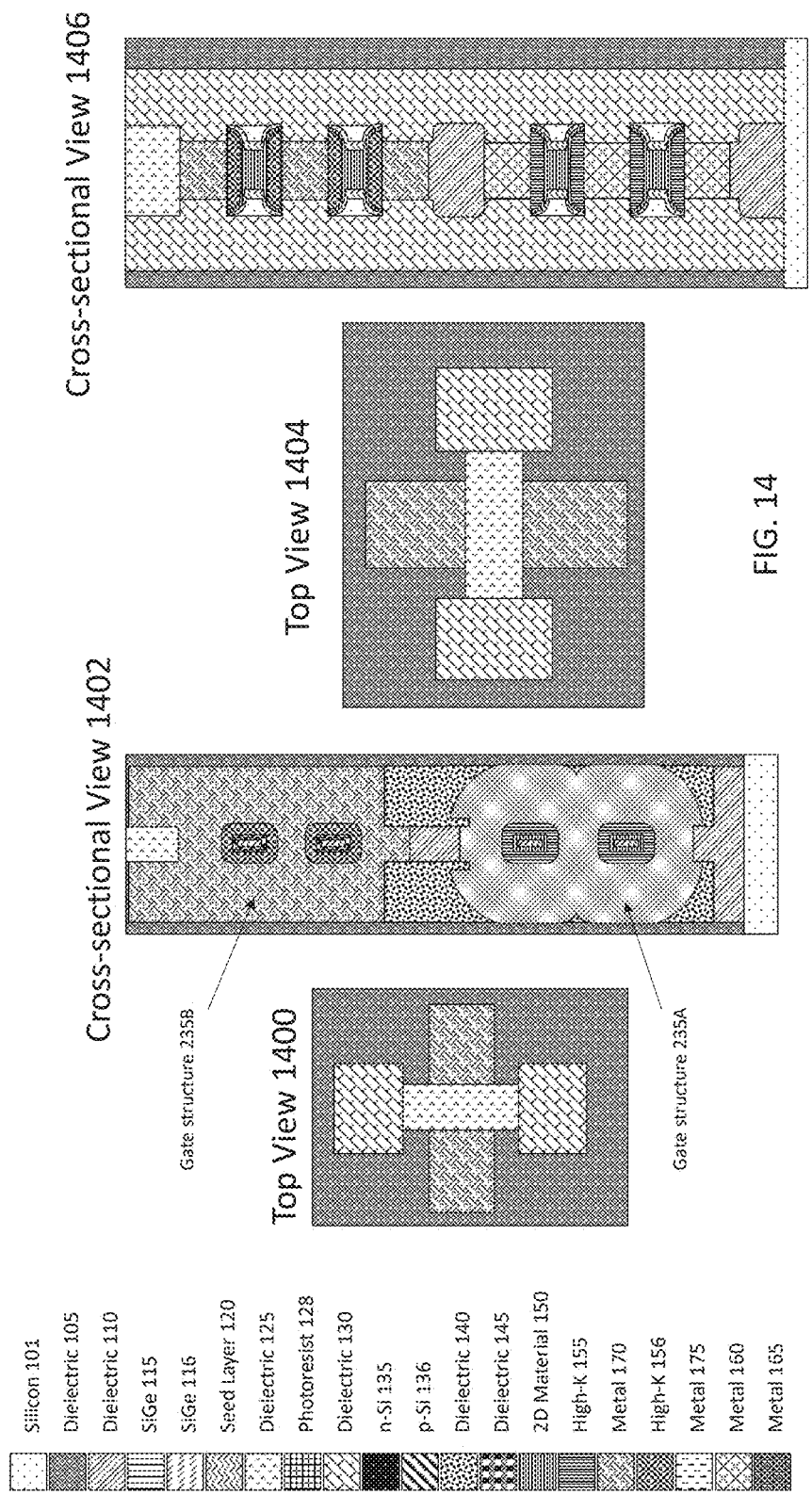

In FIG. 14, a top view 1400, a cross-sectional view 1402, a top view 1204 and a cross-sectional view 1206 are illustrated in which steps completed in connection with FIGS. 8-12 are repeated for the top transistor 100B and its 2D channels 250C and 250D. Upon completion of these steps, transistor 100B can also have completed 2D channels 250C and 250D, along with gate structure 235B that is isolated from gate structure 235A. The top transistor can include 2D channels 250 that can utilize any polarity of 2D materials 150, including any n-type or p-type materials for forming suitable n-type or p-type channels 250. Similarly, same or different types of high-k dielectrics, such as the high-k 155, can be used for any of the channels 250, and same or different gate metals, such as metal 160, and including gate metals with different work functions, can be used for gate structure 235B. The resulting structure 100 in FIG. 14 can be a complete core-flow structure from which 3D CFET transistor structures 100 can be completed. The core flow structure 100 in FIG. 14 can include the gate structures 235A and 235B along with 2D channels 250, as discussed in connection with FIG. 1.

Referring now to FIGS. 15-20, the core flow structure 100 in FIG. 14 can be used as a basis for completing 3D CFET structure 100 with 2D material and silicon recessing nanosheet. More specifically, by following the fabrication steps discussed in connection with FIGS. 15-25 the structure 100 from FIG. 14 can be modified to include the S/D structures 215A/220A for transistor 100A and S/D structures 215B/220B for transistor 100B.

In FIG. 15, a top view 1500 and a cross-sectional view 1502 are illustrated in which dielectric 130 can be etched from the top surface of the structure 100 and down until silicon substrate 101 is reached. In some implementations, a portion of the dielectric 130 can be left at the lower end of the structure, so as to surround the area at the bottom of the structure 100.

In FIG. 16, a top view 1600 and a cross-sectional view 1602 are illustrated in which the silicon 101 material in each of the leakage areas 212 of 2D channels 250A and 250B can be recess etched out. The recess etch of the silicon 101 from the leakage areas 212 can be done until seed layer 120 is reached. Etching out of silicon 101 material can be done to eliminate current leakage paths between the first S/D structure 215 and the second S/D structure 220 through the nanosheet 210. In the example illustrated in FIG. 16, four leakage areas 212 in two nanosheets 210 of the transistor 100A can be etched out, one on each side of the 2D channels 250A and 250B.

Once the silicon 101 material in the leakage areas 212 is etched out, deposit fill with dielectric 145 can be performed. Deposit fill with dielectric 145 can fill out the entire S/D regions (as shown in top view 1600). After deposit fill is done, a CMP can be performed to clear out surplus material. Finally, dielectric 145 can be directionally etched out downwards through the S/D region trenches so that the etch stops at or around dielectric 130 at the lower end of the transistor 100A, or alternatively at the end of the material layer stack (e.g., silicon substrate 101a). Directional downward etch of dielectric 145 can result in the leakage areas 212 that were previously filled with silicon 101 now be filled with dielectric 145 instead.

Figure 17:
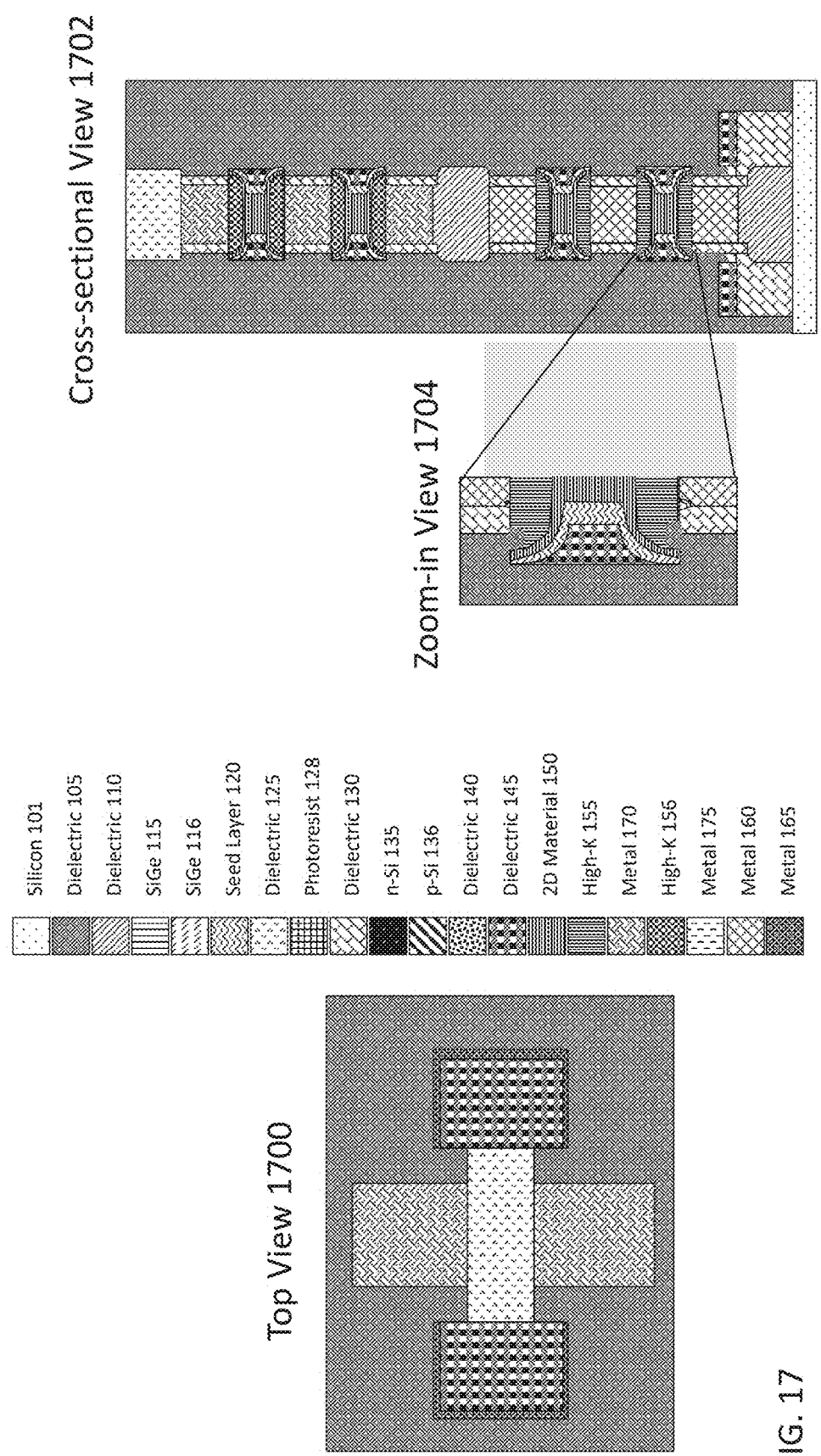

Referring now to FIG. 17, a top view 1700, a cross-sectional view 1702, and a zoom-in view 1704 are illustrated in which dielectric 130 can be recess etched. Upon completion of this recess etch, isolation walls of dielectric 130 can be slightly thinner, providing more space for electrical contact with 2D material 150 at the channels 250A and 250B. For the similar reasons, high-k 155 dielectric can also be recess etched slightly, also providing improved electrical contact with 2D material 150.

Referring now to FIG. 18, a top view 1800, a cross-sectional view 1802, and a zoom-in view 1804 are illustrated in which metal 165 can be deposit filled (e.g., shown in view 1802), thus providing first S/D structure 215 and second S/D structure 220. By deposit filling metal 165, 2D material 150 in 2D channel 250A and 250B can be in electrical contact with the first S/D structure 215A and second S/D structure 220A of the transistor 100A. Following this step, a CMP can be performed.

Figure 19:
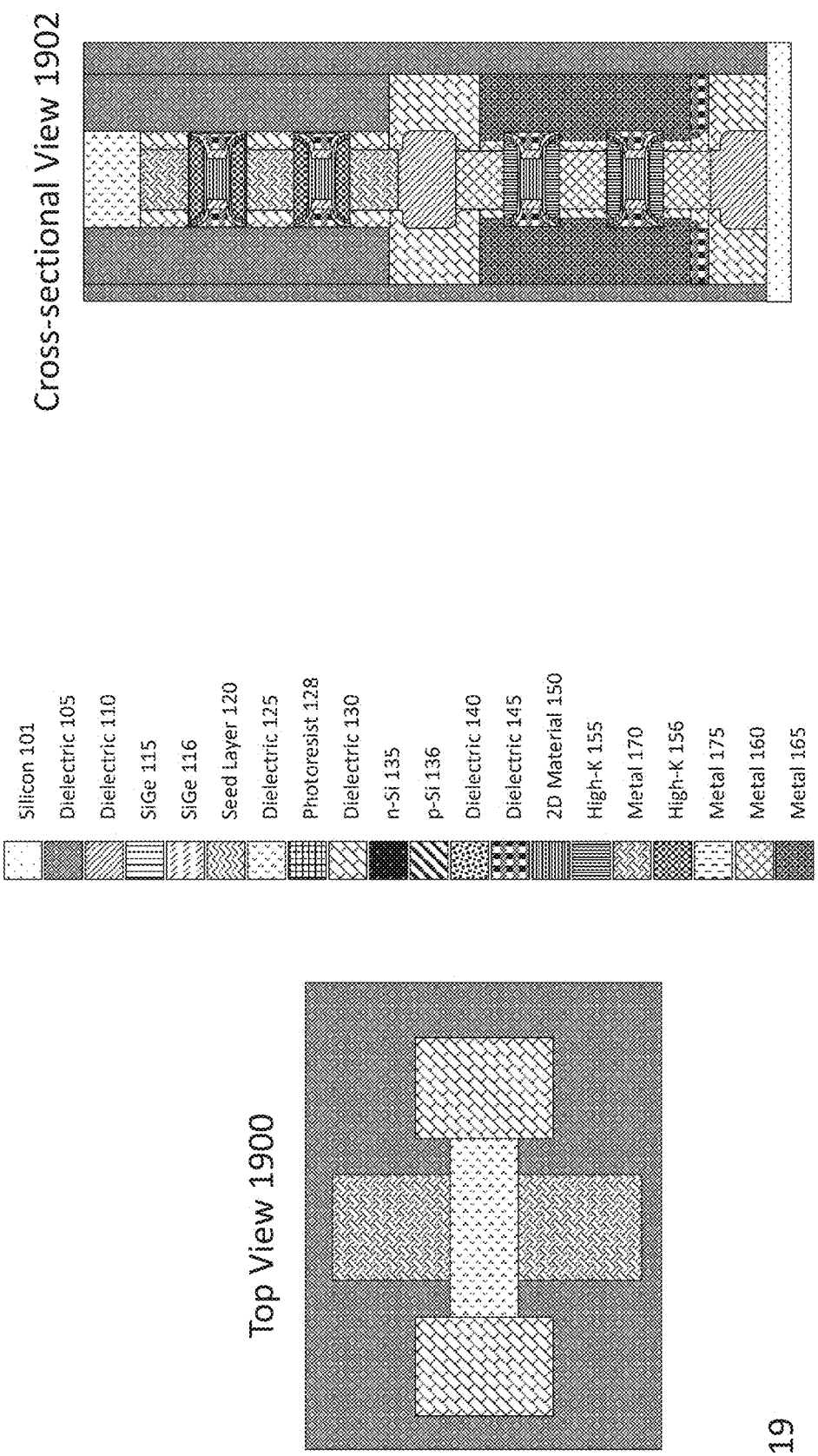

Referring now to FIG. 19, a top view 1900 and a cross-sectional view 1902 are illustrated in which the top portion of the metal 165 can be etched, leaving metal 165 only for the first and second S/D structures 215 and 220 for the transistor 100A, but removing the metal 165 for transistor 100B. Dielectric 130 can then be deposit filled on top of the metal 165, thereby providing electrical isolation between S/D structures 215A and 220A of transistor 100A and S/D structures 215B and 220B for transistor 100B to be completed. After dielectric 130 deposit filling, a CMP can be performed.

Figure 20:
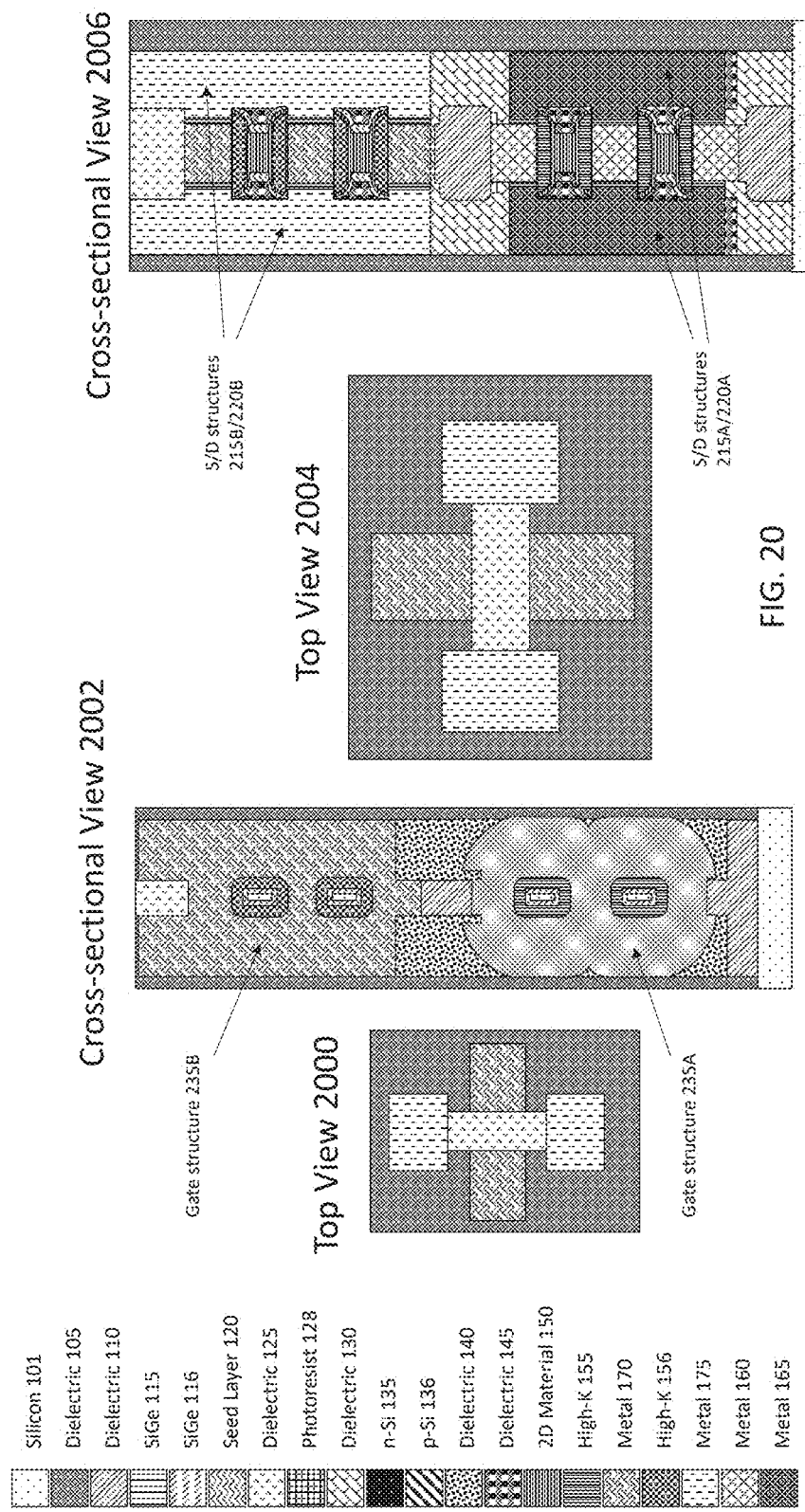

Referring now to FIG. 20, a top view 2000, a cross-sectional view 2002, a top view 2004 and a cross-sectional view 2006 are illustrated in which dielectric 130 can be removed for transistor 100B. Then recess etch of dielectric 130, followed by high-k 155 application can be performed for transistor 100B for improved contact with 2D material 150 of channels 250C and 250D, using the same or similar steps as discussed in connection with FIG. 17, with respect to channels 250A-B in transistor 100A. Then, metal 175 can be filled for first and second S/D structures 215B and 220B of transistor 100B, for which the same or similar steps as described in connection with FIG. 18 can be used. Lastly, a CMP can be performed to clear out any surplus material.

Upon completion of fabrication steps discussed in connection with FIGS. 2-20, the transistor structure 100 can be complete, resulting in the same or similar structure 110 as the one discussed in connection with FIG. 1. The resulting transistor 100A can include 2D channels 250A and 250B is at the lower end of the structure 100, and transistor 100B with 2D channels 250C and 250D can be formed above, in the upper end of the structure 100. Transistor 100A can utilize the same or different type of 2D material 150 than transistor 100B and can therefore include n-type or p-type channels 250. Likewise, transistor 100B can also include n-type or p-type transistor channels 250. Gate structures 235A and 235B, just as S/D structures 215A/220A and 215B/220B can be formed so as to be electrically isolated from each other, allowing for independent operation of the transistor 100A and 100B.

In addition, transistors 100A and 100B can also be connected using metal vias and contacts (not shown) to allow independent electrical control of S/D contacts 215A/220A and S/D contacts 215B/220B. Likewise, transistors 100A and 100B can also include separate metal contacts and vias (not shown) to allow for independent electrical control of the gate structures 235A/235B. Metal vias and contacts can be routed anywhere through, around or above structure 100, such that each one of the S/D structures 215/220 and gate structures 235 of each of the transistors 100A and 100B can have its own independent electrical path leading to the surface of the material stack. Alternatively, any combination of the contacts or vias for S/D structures 215/220 and gate structures 235 of transistors 100A and 100B can be shorted to each other, depending on the implementation.

Figure 21:
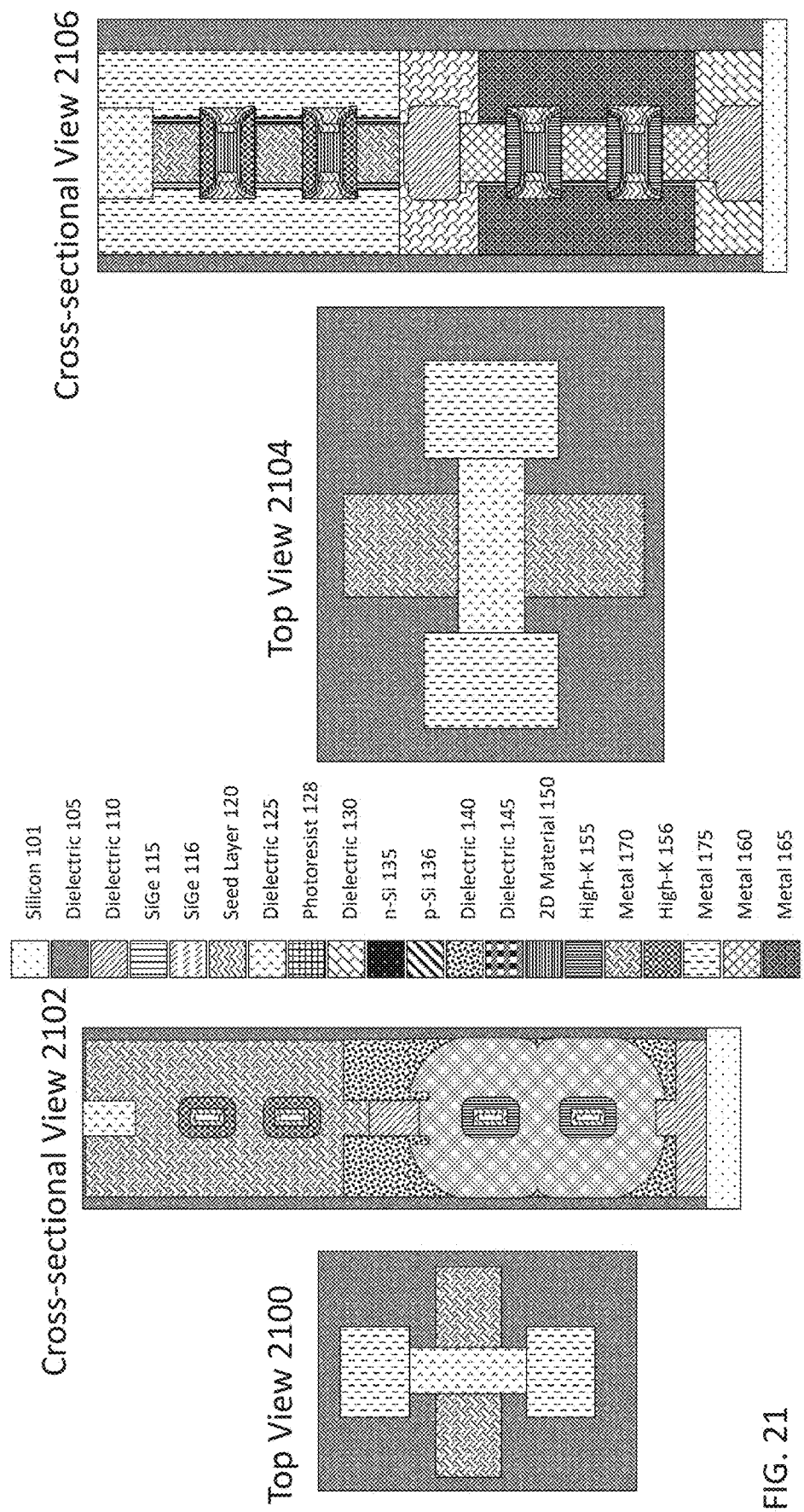
FIG. 21 includes cross-sectional, top-down and zoom-in views of an example of a modification to fabrication steps in FIGS. 15-20 to complete a 3D CFET structure with 2D material, silicon recessing and oxide formation silicon nanosheet, according to an embodiment.

In FIG. 21, a top view 2100, a cross-sectional view 2102, a top view 2104 and a cross-sectional view 2106 are illustrated in which a variation to the structure 100 in FIG. 20 can be implemented via steps in FIGS. 2A-20, with an exception with respect to the fabrication steps in connection with FIG. 16. Instead of recessing silicon 101 from the leakage area 212 and then filling the leakage area 212 in with dielectric 145 as done in FIG. 16, the leakage area 212 can be oxidized to form SiO2 instead. Oxidation and formation of SiO2 can be implemented in a variety of ways, including via dry or wet oxidation processes, or by subjecting the material to a sufficiently high temperature. Forming the layer of SiO2 on the silicon 101 can help reduce the leakage path between the S/D structures 215 and 220. This can be implemented for both transistor 100A and transistor 100B. The resulting structure can be the same or similar to the one in FIG. 20, except that the leakage area 212 will include grown SiO2 instead of the dielectric 145.

Referring now to FIGS. 22-29, the core flow structure 100 in FIG. 14 can be used as a basis for completing 3D CFET structure 100 with 2D material, silicon recessing and plasma doped silicon nanosheet. More specifically, starting with the structure 100 of FIG. 14 fabrication steps discussed in connection with FIGS. 22-29 can be implemented to produce a 3D CFET that includes epitaxially grown doped S/D structures 215A/220A (FIG. 29) for transistor 100A and epitaxially grown doped S/D structures 215B/220B (FIG. 29) for transistor 100B.

In FIG. 22, a top view 2200 and a cross-sectional view 2202 are illustrated in which the process can start from the structure 100 in FIG. 14. The structure 100 from FIG. 14 can include its dielectric 130 etched out from the top portion of the source and drain regions in the structure 100 (e.g., transistor 100B area), leaving dielectric 130 only in the lower part of the transistor 100 (e.g., transistor 100A area).

In FIG. 23, a top view 2300 and a cross-sectional view 2302 are illustrated in which dielectric 145 can be deposited into the source and drain cavities left by the etching in FIG. 22, such that dielectric 145 can fill in and protect the transistor 100B area from upcoming etching. Once dielectric 145 is filled into the previously etched out top portion of the source/drain areas of the transistor 100B structure (e.g., the top part of the structure 100), a narrow directional downward etch through dielectric 145 can be performed. The narrow directional etch can have a hole diameter that is smaller than the diameter of the cavity filled by dielectric 145. The etching can take place through the smaller diameter hole and towards dielectric 130 in the transistor 100A area (e.g., lower part of transistor structure 100).

The narrow directional etch through the dielectric 145 filling can be implemented in order to gain access to the dielectric 130 left beneath dielectric 145. Through the opening in the dielectric 145, dielectric 130 can be etched out isotopically so as to clear out the entire dielectric 130, except for the thin walls around the gate structure 235A. The etching step can open up the silicon 101 surface at the substrate 101a.

Figure 24:
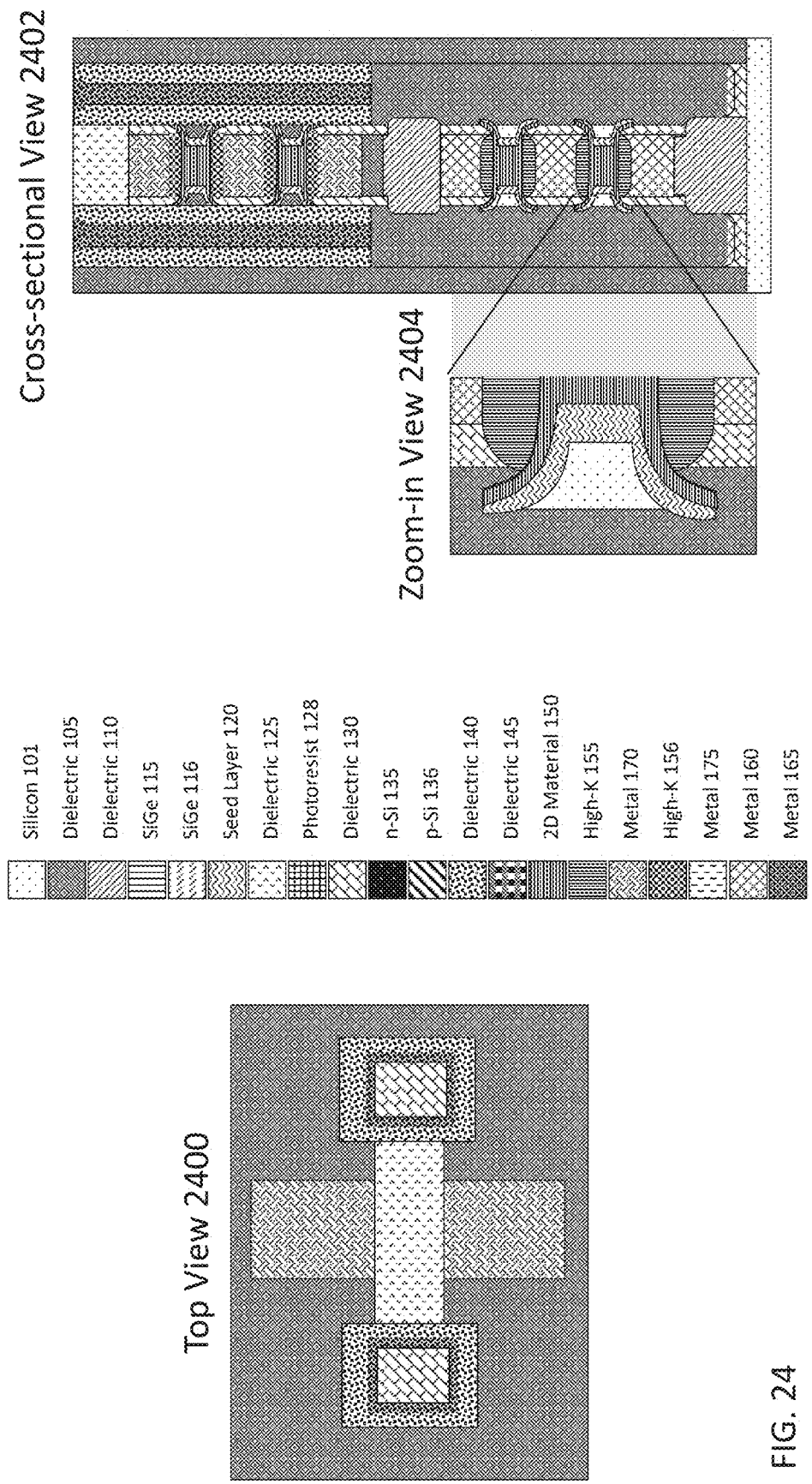

In FIG. 24, a top view 2400, a cross-sectional view 2402 and a zoom-in view 2404 are illustrated in which a recess etch of high-k 155 dielectric can be implemented. By recess etching the high-k 155, more area of contact between the source drain metal and 2D material 150 can be provided.

Figure 25:
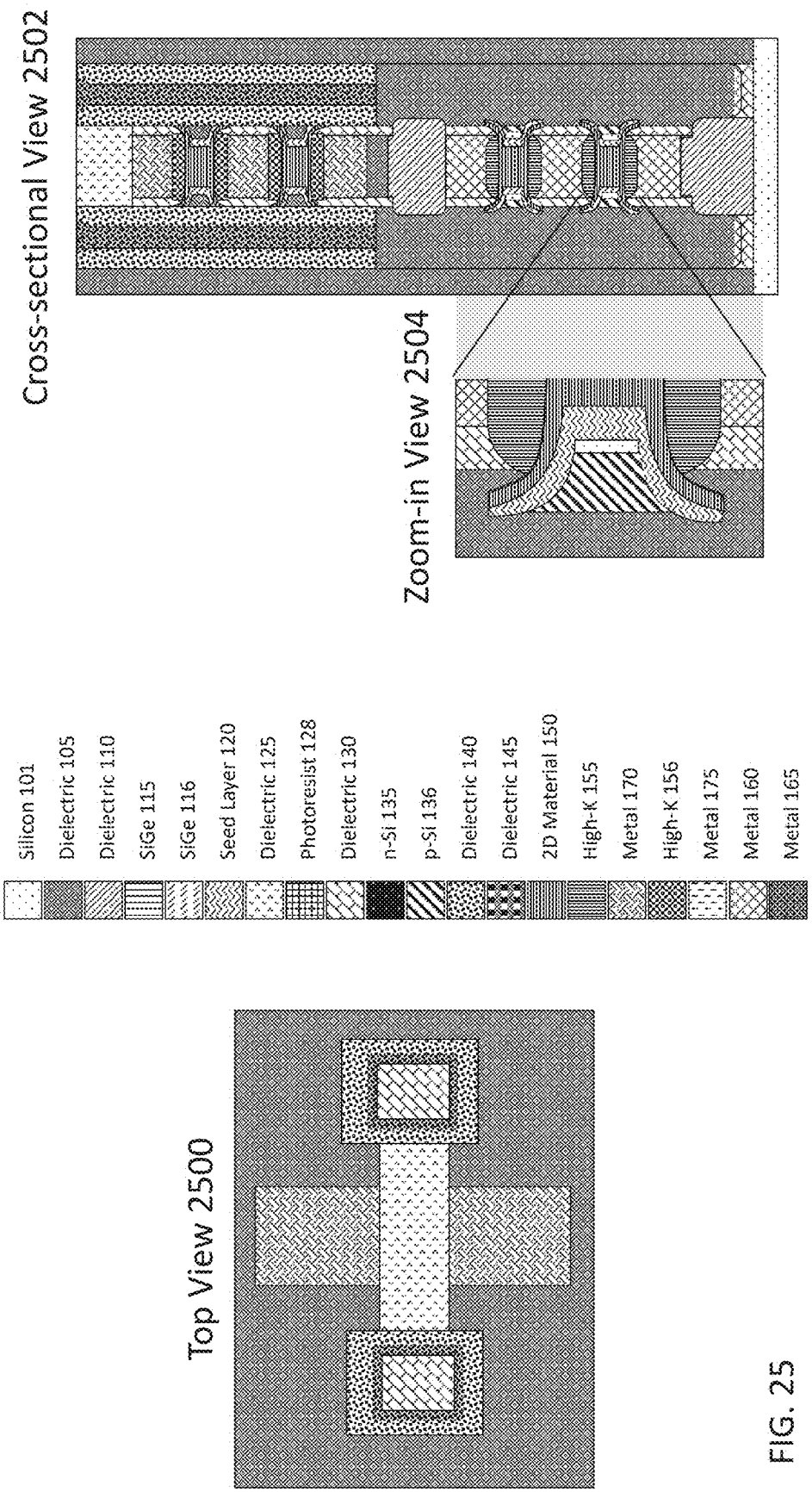

In FIG. 25, a top view 2500, a cross-sectional view 2502 and a zoom-in view 2504 are illustrated in which the leakage areas 212 (FIG. 27) of the nanosheet 210 (FIG. 27) can be plasma doped with polarity that is opposite to the polarity of the source and drain contacts 215 and 220 (FIG. 27) that will be epitaxially grown in the upcoming steps. The reversed polarity of the leakage areas 212 in the carrier nanosheets 210 helps to form a reverse-biased p-n junction diode structure at the interface between the nanosheet 210 and the source and drain 215 and 220 structures to be formed. In the example in FIG. 25, leakage areas 212 of the 2D channels 250A and 250B are plasma doped to have p-doped polarity and are indicated as p-Si 136 material. These p-type doped leakage areas 212 of 2D channels 250A and 250B (FIG. 27) can form the p-n junction with the n-type doped S/D structures 215A and 220A to be formed next.

Figure 26:
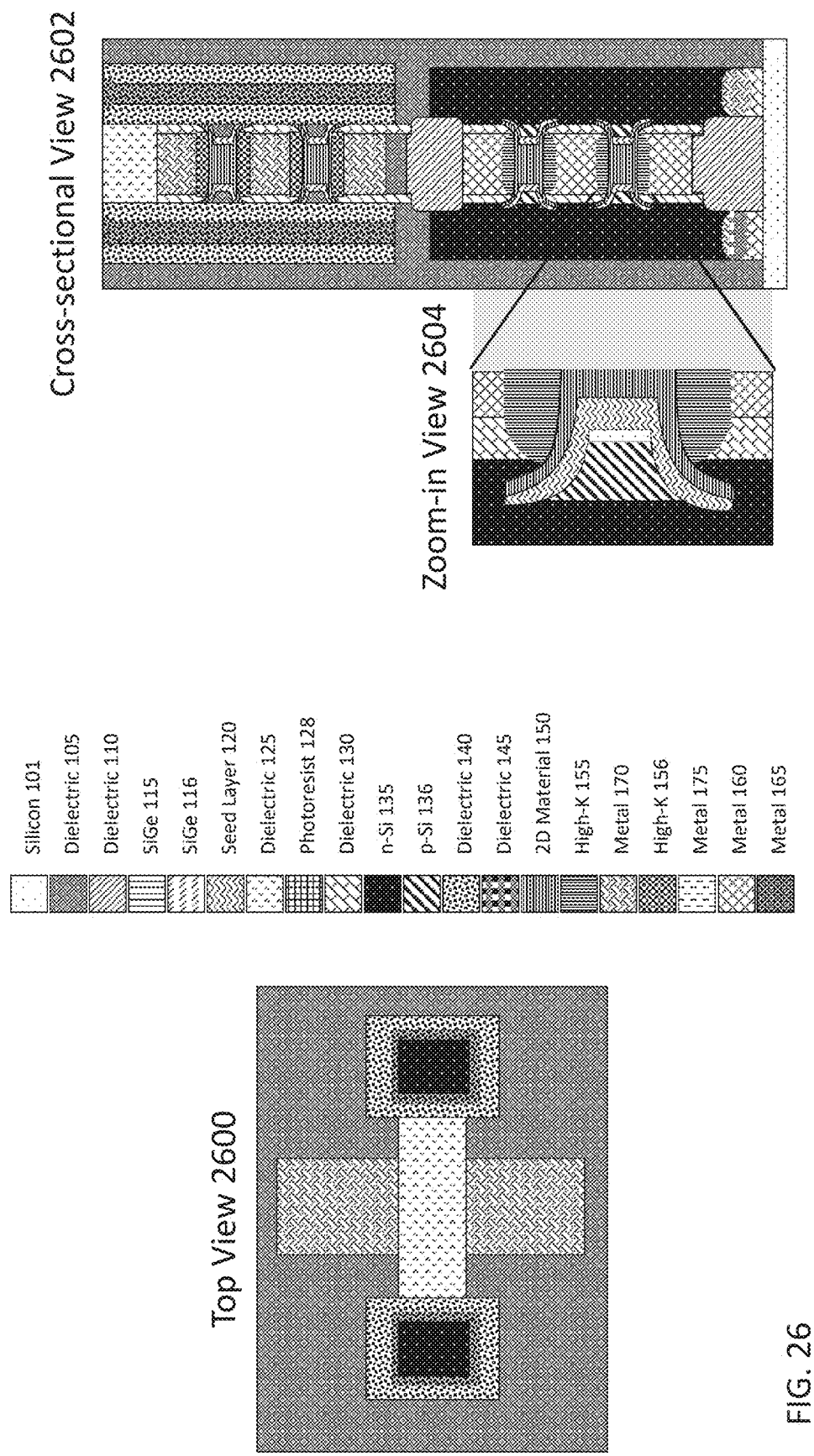

In FIG. 26, a top view 2600, a cross-sectional view 2602 and a zoom-in view 2604 are illustrated in which source and drain structures 215A and 220A for transistor 100A can be formed by epitaxially growing doped silicon 101 to be in contact with the silicon nanosheet 210 that was doped in FIG. 25. In this step, n-Si 135 material (e.g., epitaxially grown n-type doped silicon) can be formed inside the regions for the S/D structures 215 and 220 for the transistor 100A (e.g., at the lower end of the structure 100). The polarity of the doped and epitaxially grown source and drain contacts 215A and 220A can be opposite of the polarity at the leakage areas 212. Since the source and drain contacts 215A and 220A can have an n-type doping polarity due to n-Si 135, their polarity will be reversed of the p-type polarity of the leakage areas 212 in nanosheets 210 of the 2D channels 250A and 250B.

Figure 27:
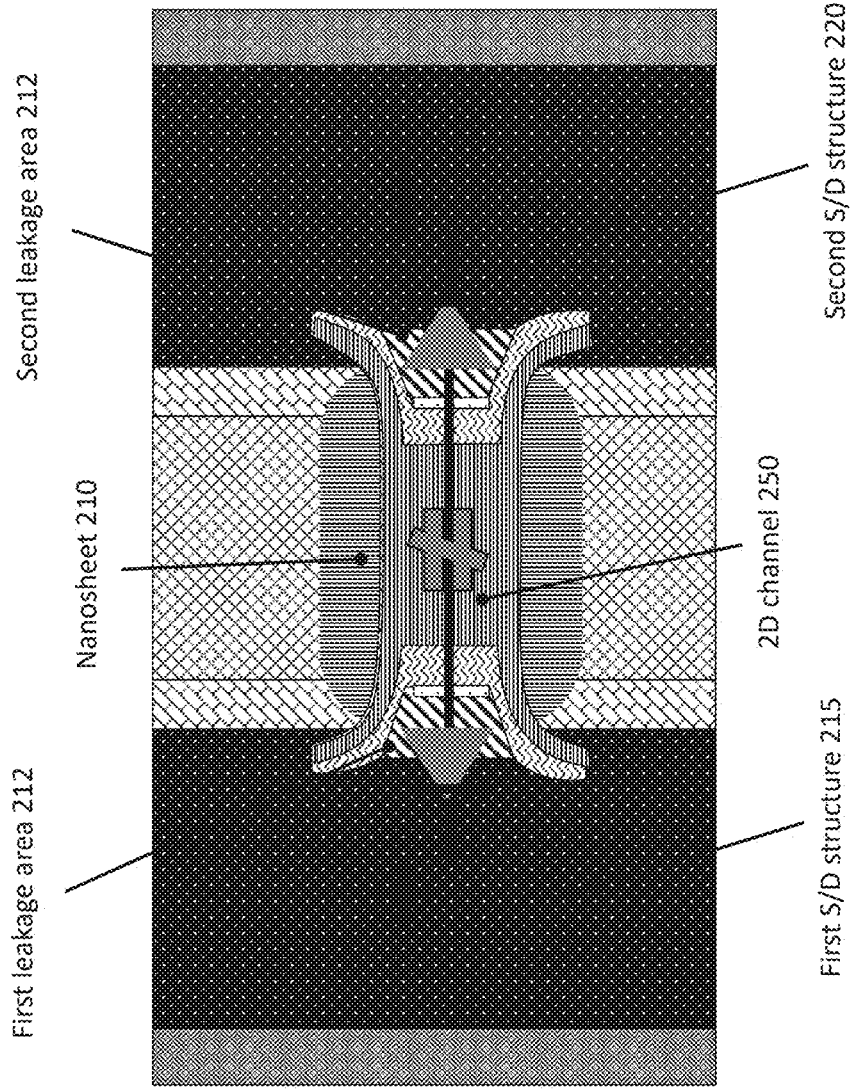

Referring now to FIG. 27, a 2D channel 250 of the transistor 100A is illustrated showing a p-n junction formed between a first S/D structure 215A and a first end of the 2D channel 250. More specifically, the p-n junction can be formed between the first S/D structure 215A and a first leakage area 212 of the 2D channel 250 interfacing with the first S/D structure 215A. Also illustrated is a second p-n junction formed between a second S/D structure 220 and a second end of the 2D channel 250. More specifically, the second p-n junction can be formed between the second S/D structure 220 and the second leakage area 212 of the 2D channel 250.

The two p-n junction diodes can be formed due to the materials of opposite polarities (e.g., n-type and p-type) coming into physical contact at the interfaces between the S/D structures 215 and 220 and the leakage areas 212 of the 2D channel 250. The orientation of the diodes can be such that one diode is in a forward bias, while the other diode is in a reverse bias, thus reducing leakage currents through the carrier nanosheets 210 of the 2D channels 250A and 250B.

In FIG. 28, a top view 2800 and a cross-sectional view 2802 are illustrated in which a dielectric 145 can be deposit filled on top of the n-Si 135 material that was deposited in FIG. 26. A CMP can be performed to clear any surplus material from this deposition. A directional downward etch can be performed through dielectric 145 to take out most of the dielectric 145 from the transistor 100B area (e.g., the top part of the structure 100), thereby leaving only a thin layer of dielectric 145 between the transistor 100A and 100B regions to isolate S/D structures 215A/220A of the transistor 100A from the S/D structures 215B/220B of the transistor 100B to be formed next.

A plasma doping of the leakage areas 212 in the 2D channels 250C and 250D of the transistor 100B can be performed so as to n-type dope the leakage areas 212 in 2D channels 250C and 250D. This would ensure that p-n junctions are formed once the p-type S/D structures 215B and 220B are epitaxially grown next to the n-type doped nanosheets 215 of the 2D channels 250C and 250D.

Figure 29:
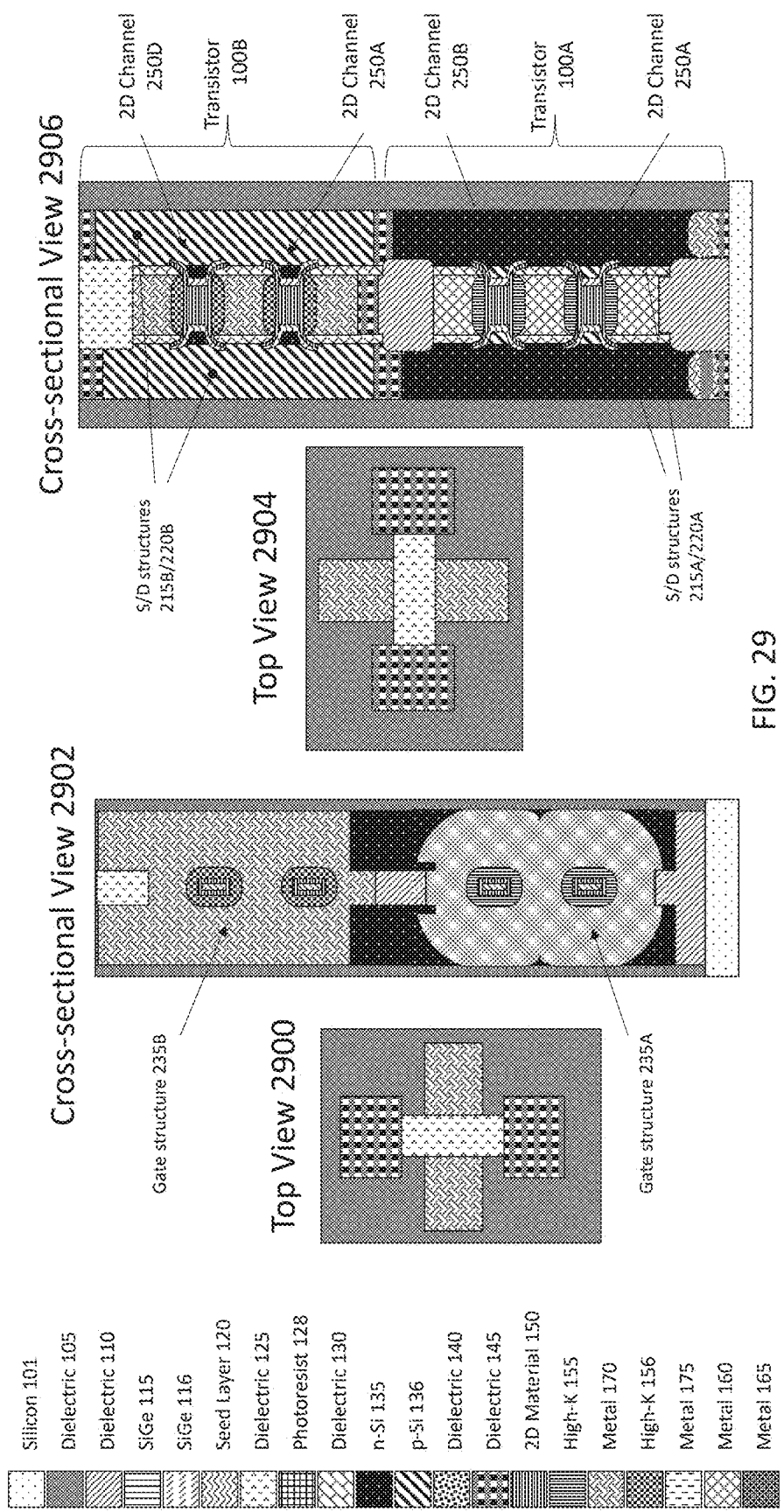

In FIG. 29, a top view 2900, a cross-sectional view 2902, a top view 2904 and a cross-sectional view 2906 are illustrated in which material p-Si 136 is epitaxially grown (e.g., made up of p-type doped silicon) in the S/D regions for the transistor 100B, so as to form S/D structures 215B and 220B. Once this is completed, the remainder of the S/D contact areas can be filled with dielectric 145, which can be followed by a CMP to complete the structure. The resulting structure in FIG. 29 can therefore include a completed structure 100 with a transistor 100A including S/D structures 215A/220A and a gate structure 235A and a transistor 100B including S/D structures 215B/220B and a gate structure 235B.

Following steps in FIGS. 22-29, the resulting structure 100 can include transistor 100A at the lower end and a transistor 100B at its upper end. Transistor 100A can include 2D channels 250A and 250B whose leakage areas 212 are p-type doped. The S/D structures 215A and 220A of transistor 100A can be formed with an n-type doped epitaxially grown silicon (e.g., n-Si 135), so that p-n junctions can be formed between the p-type doped leakage areas 212 in 2D channels 250A and 250B and the n-type doped S/D structures 215A and 220A.

Similarly, the resulting transistor structure 100 can also include the transistor 100B having 2D channels 250C and 250D whose leakage areas 212 are n-type doped. The S/D structures 215B and 220B of transistor 100B can be formed with p-type doped epitaxially grown silicon, which can thereby form p-n junctions between the n-type doped leakage areas 212 in 2D channels 250C and 250D and the S/D structures 215B and 220B. The reversed polarity between the leakage areas 212 of the 2D channels 250 and the S/D structures 215 and 220 for both transistors 100A and 100B can thereby ensure that in any configuration at least one of the p-n junctions operates in a reverse bias, thereby preventing leakage currents from taking place during transistor operation.

Referring now to FIG. 30, a top view 3000 and a cross-sectional view 3002 are illustrated in which a new material stack that includes n-type and p-type silicon layers can be used together with the core flow structure 100 in FIGS. 2A-14 and FIGS. 22-29 to complete a 3D CFET structure 100 with 2D material, silicon recessing and plasma doped silicon nanosheet. The 3D CFET structure 100 formed using this process can utilize the same or similar steps as in FIGS. 2A-14 and 22-29, but using a material stack that can include one or more n-type and p-type doped epitaxially grown silicon layers.

Shown in FIG. 30 is the material stack that can include a silicon substrate 101a, on top of which can be a layer of SiGe 115, on top of which can be a layer of SiGe 116, on top of which can be a first layer of p-type doped epitaxially grown silicon p-Si 136, on top of which can be a second layer of SiGe 116, on top of which can be a second layer of p-type doped epitaxially grown silicon p-Si 136, on top of which can be a third layer of SiGe 116, on top of which can be a second layer of SiGe 115, on top of which can be fourth layer of SiGe 116, on top of which can be a first layer of n-type doped epitaxially grown silicon n-Si 135, on top of which can be a fifth layer of SiGe 116, on top of which can be a second layer of n-type doped epitaxially grown silicon n-Si 135, on top of which can be a sixth layer of SiGe 116, on top of which can be a protecting layer, such as a dielectric 105.

By following the fabrication steps in FIGS. 2A-14 and 22-29 starting from the material stack in FIG. 30, doping of the leakage areas 212 may no longer be need to be performed because leakage areas 212 of the doped nanosheet 210 (e.g., formed by n-Si 135 or p-Si 136) will already be doped. At that point, because n-type silicon nanosheets 210 will be formed at the 2D channels 250A and 250B at the lower end of the structure 100 (e.g., at the transistor 100A level) the S/D structures 215A and 220A can include p-type doped silicon (e.g., p-Si 136) in order to form the p-n junctions with the nanosheets of the 2D channels 250A and 250B. Likewise, because p-type silicon nanosheets are formed at the 2D channels 250C and 250D upper end of the structure 100 (e.g., at the transistor 100B level) the S/D structures 215B and 200B can include n-type doped silicon (e.g., n-Si 135) in order to form p-n junctions with the nanosheets 210 of the 2D channels 250C and 250D.

Figure 31:
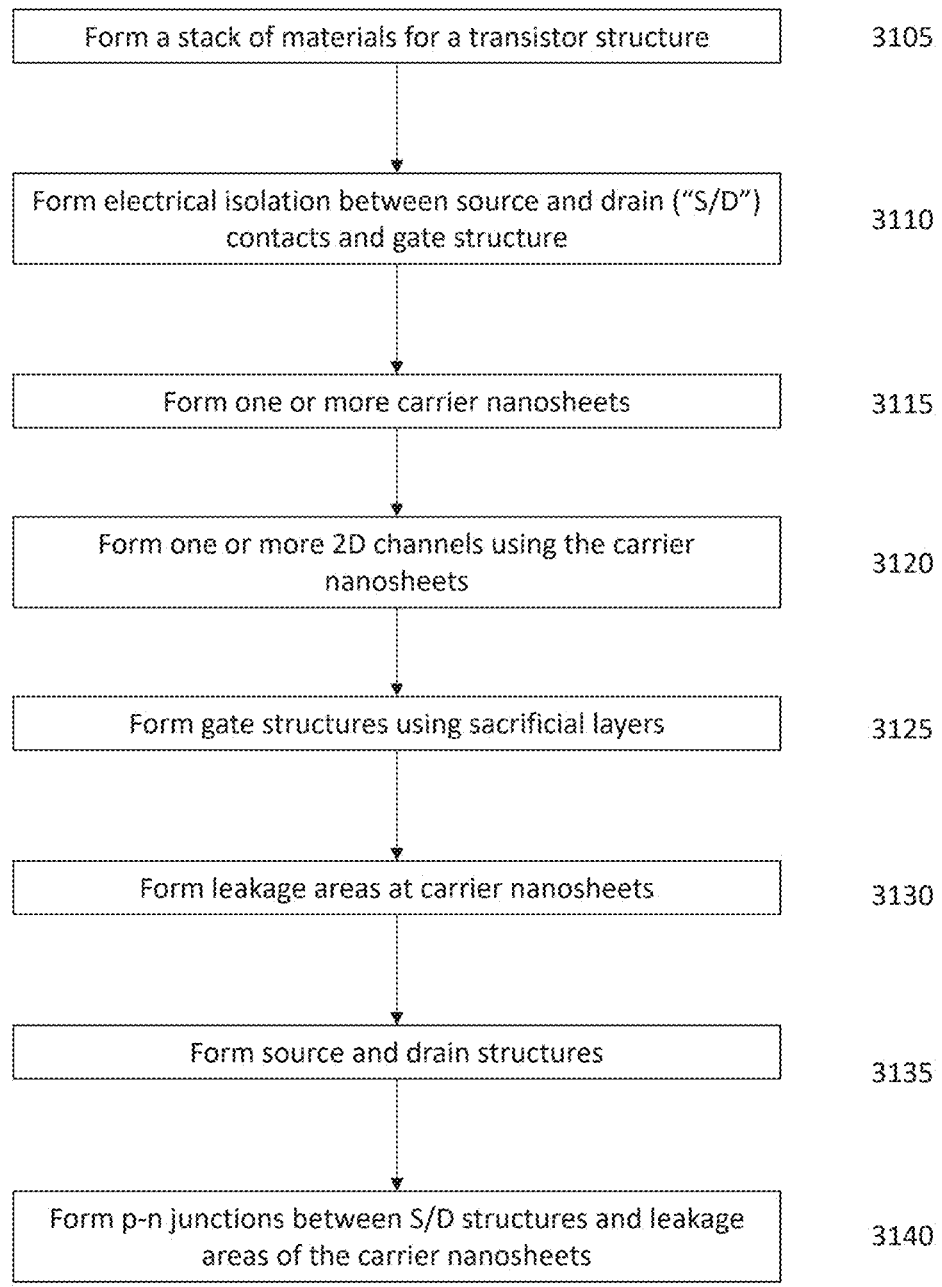
FIG. 31 is a flow diagrams of example methods for fabricating 3D CFET structure using process flows described in connection with FIGS. 1-30, according to one or more embodiments.

Referring now to FIG. 31, illustrated is a flow diagram of an example method 3100 for fabricating one or more transistors 100 using a 3D structure with 2D materials techniques shown and discussed in connection with FIGS. 1-30. In some aspects, the method 3000 relates to process steps for fabricating a 3D CFET structure 100 using one or more 2D material channels 250 and carrier nanosheets 210. In some aspects, the method 3100 relates to fabricating two or more transistors 100A and 100B, such as those described in connection with FIGS. 1-30 and that utilize 2D channels 250 and that are stacked on top of each other.

The method 3100 of FIG. 31 can include a series of steps 3105 to 3140 for fabricating structures shown in FIGS. 1-30. Step 3105 can include forming a stack of materials for a transistor structure. Step 3110 can include forming electrical isolation between source and drain contacts and the gate structure. Step 3115 can include forming one or more carrier nanosheets. Step 3120 can include forming one or more 2D channels using the carrier nanosheets. Step 3125 can include forming gate structures using sacrificial layers. Step 3130 can include forming leakage areas at carrier nanosheets. Step 3135 can include forming source and drain structures. Step 3140 can include forming p-n junctions between source and drain structures and leakage areas at carrier nanosheets.

Step 3105 can include forming a stack of materials for fabricating a transistor structure 100. The stack of materials can include a plurality of material layers that can be epitaxially grown, deposited or otherwise applied on a substrate, such as a silicon substrate 101a. The material layers can be stacked one on top of another using any technique known or used in the field. Even though substrate 101a in the illustrated example includes a silicon substrate, substrate 101a can include any semiconductor substrate or any other material substrate, including glass, ceramic, or metal. The stack of materials can include any number of layers of dielectric, metal, 2D materials, or other materials described herein or known or used in the industry. The material stack can include a layer of sacrificial material or any other material that can be fully or partially etched or removed during the process, such as SiGe 115 and SiGe 116, as well as dielectrics 105, 110, 125, 130, 140 and 145, high-k dielectric 155, any one or more metals, such as 160, 165, 170 or 175, or any epitaxially grown doped semiconductors, such as n-Si 135 (e.g., n-type doped silicon 101) or p-Si 136 (e.g., p-type doped silicon 101).

The stack of materials can be formed on a substrate 101a in any number of layers. The material stack can include layers of various thicknesses and sizes. The stack of materials can include the arrangement of materials as illustrated in cross-sectional view 102 of the FIG. 2A. For example, the material stack can include the following arrangement of material layers, where the layers are stacked on top of Silicon substrate 101a in the following order: a first layer of SiGe 115 is formed, on top of which a first layer of SiGe 116 can be formed, on top of which a first layer of silicon 101 can be formed, on top of which a second layer of SiGe 116 can be formed, on top of which is a second layer of silicon 101, on top of which is a third layer of SiGe 116, on top of which is a second layer of SiGe 115, on top of which is a fourth layer of SiGe 116, on top of which is a third layer of Silicon 101, on top of which is a fifth layer of SiGe 116, on top of which is a fourth layer of Silicon 101, on top of which is a sixth layer of SiGe 116, on top of which is a dielectric 125. Dielectric 125 can remain the top layer and act as a hard mask protecting the material stack during upcoming fabrication steps.

Alternatively or additionally, material stack can include an arrangement of materials same or similar as shown in FIG. 30. For example, the stack can be formed on a silicon substrate 101a on top of which can be a layer of SiGe 115, on top of which can be a layer of SiGe 116, on top of which can be a first layer of p-type doped epitaxially grown silicon p-Si 136, on top of which can be a second layer of SiGe 116, on top of which can be a second layer of p-type doped epitaxially grown silicon p-Si 136, on top of which can be a third layer of SiGe 116, on top of which can be a second layer of SiGe 115, on top of which can be fourth layer of SiGe 116, on top of which can be a first layer of n-type doped epitaxially grown silicon n-Si 135, on top of which can be a fifth layer of SiGe 116, on top of which can be a second layer of n-type doped epitaxially grown silicon n-Si 135, on top of which can be a sixth layer of SiGe 116, on top of which can be a protecting layer, such as a dielectric 105. In some implementations, the p-Si 136 and n-Si 135 layers in this stack can be swapped with each other, so that n-Si 135 is at the lower part of the structure 100 and p-Si 136 is at the upper part of the structure 100.

Step 3110 can include forming electrical isolation between source and drain contacts and the gate structure. Any number of electrical isolation layers can be formed between the S/D structures 215 and 220 and gate structure 235 for transistor 100A, transistor 100B or any number of transistors in the structure 100. Depending on the implementation, electrical isolation between the source and drain contacts 215 and 220 and gate structure 235 can be implemented for transistors 100A or 100B individually, or can be implemented for the entire structure 100 as a whole. For example, when structure 100 includes a single transistor having multiple 2D channels 250, the electrical isolation between S/D structures 215 and 220 and the gate structure 235 can be for the entire structure 100.

Electrical isolation can be implemented using the steps or techniques discussed, for example, in connection with FIG. 4 in which SiGe 116 is recess etched to provide a thin layer for isolating S/D structures 215 and 220 yet to be formed from the gate structure 235 yet to be formed. Also, electrical isolation can be implemented using steps and techniques in FIG. 5 in which dielectric 130 is filled into S/D structure or contact regions, from which it is then directionally etched in FIG. 15, so as to leave a thin layer of dielectric 130 remaining on the outer surface of the gate structures 235A and 235B to provide electrical isolation to the gate structures 235A and 235B from the surrounding S/D structures 215 and 220.

Step 3115 can include forming one or more carrier nanosheets. Carrier nanosheets 210 or nanosheets 210 can be formed from the one or more layers of silicon 101 material from the material stack, as shown in FIGS. 1-29. Alternatively, nanosheets 210 can be formed from epitaxially grown n-type doped n-Si 135 layers and/or epitaxially grown p-type doped p-Si 135 layers as shown in connection with the stack in FIG. 30 to be processed in accordance with FIGS. 1-14 and 22-29.

Carrier nanosheets 210 can further be formed using steps and techniques discussed in connection with FIGS. 8-9 in which silicon 101 layers are isolated by etching the surrounding dielectric 110 to gain access to silicon 101 layers of the stack. As discussed, for example, in FIG. 9, one or more silicon nanosheets 210 can be isotopically recess etched or isotropically recess etched at their exposed top and bottom surfaces.

Recess etching the exposed surfaces can form a shaped structure due to the isotropic wet etchant etching the top and bottom surfaces, but not etching the side surfaces that are protected by the dielectric 130 at the two distal ends of the material stack at shown in FIGS. 8-9. The isotropic wet etching of the top surface of the nanosheet 210 can form an inward curve (e.g., a concave down), while at the bottom surface of the nanosheet 210 it can also form an inward curve (e.g., a concave up). As the distal ends of the carrier nanosheet 210 are protected by dielectric 130, the resulting shape can include a flare-like ending on the two surfaces interfacing with dielectric 130.

Step 3120 can include forming one or more 2D channels 250 using carrier nanosheets 210. For example, one or more 2D channels 250 can be formed for any transistor, such as transistor 100A or transistor 100B in the structure 100. 2D channels 250 can be formed so as to extend between the S/D structures 215 and 220 for any transistor, such as transistor 215A and 220A of transistor 100A or S/D structures 215B and 220B of the transistor 100B, shown for example in FIGS. 20 and 29.

A 2D channel 250 can be formed by applying a seed layer 120 over the nanosheet 210 and then applying 2D material 150 over the seed layer 120. As 2D material 150 can be electrically conductive, it can form the main electrical path between the S/D structures 215 and 220 during transistor operation. 2D channels 250 can also each include one or more leakage areas 212 at the distal ends of the structure. The leakage areas 212 can be electrically insulating preventing electrical current through it. The two ends of the carrier nanosheet 210 spanning the source and drain contacts 215 and 220 can allow for the 2D material 150 to form an electrical path with the S/D structures 215 and 220, while leaving leakage areas 212 of the nanosheets 210 of the 2D channels 250 isolated.

2D channels 250 can be formed using for example steps and techniques discussed in connection with FIG. 10 in which seed layer is applied or grown on a silicon nanosheet 210 to provide platform for 2D material 150. As discussed in FIG. 11, recess etch of the seed layer 120 can be performed and then 2D material 150 can be selectively deposited onto seed layer 120. In addition, as shown for example in FIG. 12, high-k dielectric 155 can be formed so as to interface with or surround 2D material 150.

Step 3125 can include forming gate structures using sacrificial layers. Gate structures 235, such as gate structures 235A and 235B, can be formed in the spaces and areas initially occupied by sacrificial layers, such as layers of SiGe 115 or SiGe 116. For example, as shown in FIG. 8, the three lower SiGe 116 layers are etched out to make the space for the gate structure 235A of transistor 100A. Once the channels 250A and 250B are formed, in FIG. 12 gate structure 235 is formed in the spaces previously occupied by the three SiGe 116 layers removed in FIG. 8. While gate structure 235A of transistor 100A is being formed, SiGe 116 layers to be used for the gate structure 235B (e.g., the gate structure above the gate structure being formed) can remain protected by a dielectric, such as for example discussed in connection with FIG. 8. Likewise, gate structure 235 can be formed using the steps and techniques discussed in connection with FIG. 14 in which gate structure 235B is fabricated for transistor 100B.

The gate structure 235 can include a high-k 155 and a gate metal, such as metal 160 or metal 170. Depending on the implementation the gate structure 235 can interface with a 2D channel 250 on only one side or one surface of the 2D channel 250. In some implementations, the gate structure 235 can interface with the 2D channel 250 on two surfaces, three surfaces, four or more surfaces of the 2D channel 250. Gate structure 235 can partially surround the 2D channel 250. In some implementations, the gate structure 235 can fully surround or envelop the 2D channel 250. For example, gate structure 235 can form a ring around a 2D channel 250, surrounding 2D channel 250 from 360 degrees (e.g., all angles) around the length the 2D channel 250, leaving out only the sides through which 2D channel 250 is connected to the source and drain contacts 215 and 220.

In the implementations in which a gate structure 235 contacts multiple 2D channels 250, gate structure 235 can form a ring around each of the 2D channels 250. For example, as shown in FIGS. 12, 20 and 29, the gate structures 235 (e.g., gate structure 235A or 235B) form a ring around each of the 2D channels 250, such that the gate structure 235A forms a ring around, or otherwise surrounds from 360 degrees around the length of the channels both 2D channels 250A and 250B, while the gate structure 235B forms a ring around both 2D channels 250C and 250D.

Step 3130 can include forming leakage areas at carrier nanosheets. A carrier nanosheet 210 can include leakage areas 212, which can be formed on surfaces which are not covered by a seed layer 120. Leakage areas 212 can also form due to the dielectric 130 preventing isotopic or isotropic etching of the silicon nanosheet 210, such as discussed in connection with FIG. 9. Leakage areas 212 of the carrier nanosheets 210 can be formed at the distal ends of the nanosheets 210 which are to interface with source and drain contacts 215 and 220. Because of their location at or close to the electrical interface of source/drain contact 215/220 and 2D channel 250, leakage areas 212 can leak current, unless this is prevented by either a dielectric material disposed between this interface or a reverse bias diode.

A dielectric material can be formed on the leakage areas 212 to prevent current leakage through the leakage area 212 into the 2D channel 250. A dielectric material can be inserted into the leakage area 212 in order to provide electrical isolation between the source/drain contacts 215/220 and the leakage area 212 of the carrier nanosheet 210. For example, as shown in FIG. 16, silicon can be recessed from out of the leakage area 212 and then dielectric 145 can be deposit filled in order to fill out leakage areas 212.

Step 3135 can include forming source and drain structures. Source and drain structures can be formed at the ends of the 2D channels 250. A source contact and a drain contact (e.g., source/drain contacts 215/220) can be formed using metal or epitaxially grown doped semiconductor. In some embodiments, S/D structures 215/220 are formed using metals, such as metal 165 and metal 175. In some embodiments, S/D structures 215/220 are formed using epitaxially grown doped semiconductors, such as n-Si 135 and p-Si 136.

As shown, for example in FIGS. 18-20, S/D structures 215A and 220A for transistor 100A are formed with metal 165 and S/D structures 215B and 220B for transistor 100B are formed with metal 175. As shown in FIGS. 26-29, S/D structures 215 and 220 for transistors 100A and 100B can be formed with a doped and epitaxially grown semiconductors. For example, in FIG. 26, n-type doped semiconductor is used to create S/D structures 215A and 220A, while in FIG. 29, a p-type doped semiconductor is used to create S/D structures 215B and 220B. In some embodiments, the polarity can be reversed, so that p-type doped semiconductors is used to create S/D structures 215A and 220A, while n-type doped semiconductors are used to create S/D structures 215B and 220B. In some embodiments, all S/D structures 215 and 220 in the structure 100 include same type material, either n-type or p-type.

Step 3140 can include forming p-n junctions between source and drain structures and leakage areas of the carrier nanosheets. A p-n junction can be formed between the carrier nanosheet 210 and a S/D structure 215 and 220. For example, if an end of a carrier nanosheet 210, such as leakage area 212 at a distal end of the nanosheet 210 or channel 250, is n-doped and is interfaced with a p-doped S/D structure 215 or 220, a p-n junction between these two parts can be formed. Similarly, if an end of a nanosheet 210, such as a leakage area 212, is p-doped and is interfaced with an n-type doped S/D structure 215 or 220, a p-n junction between the two parts can be formed. Depending on the direction of electrical current, the p-n junctions would be in a forward or a reverse bias. However, if the structure is formed such that reversed polarization is done at the two ends of the nanosheet 210, then regardless of the current flow, one of the diodes would always be in a reverse bias, thereby reducing leakage current.

A shown for example in FIG. 27, a 2D channel 250 can include a nanosheet 210 whose two ends (e.g., on the left side and right side) interfacing with S/D structures 215 and 220 are doped. More specifically, leakage areas 212 at the nanosheet 210 ends are doped in a reversed polarity from the doping of the epitaxially grown doped S/D structures 215 and 220. In turn, this forms diodes that are in reverse orientation, so that at least one of the two diodes (ether at the interface of S/D structure 215 or S/D structure 220) is reverse biased. By ensuring that one of the two diodes is in a reverse bias, leakage area 212 can prevent leakage currents from forming through 2D channel 250.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features described only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A device comprising:
   a first source contact;
   a first drain contact;
   a first carrier nanosheet including a first portion and a second portion;
   a first 2D material disposed on the first carrier nanosheet, the first 2D material forming a channel between the first source and first drain contacts and including a first portion, a second portion, and a third portion between the first and second portion, wherein the first and second portions respectively extend away from the third portion, wherein the first portion and the second portion of the first 2D material surround the first portion and the second portion of the first carrier nanosheet, respectively; and
   a first gate structure including a first gate dielectric and a first gate contact, the first gate structure surrounding at least the third portion of the first 2D material.

2. The device of claim 1, wherein at least one of the first source contact or the first drain contact include a doped semiconductor material.

3. The device of claim 1, wherein the first portion of the first 2D material includes a first curved profile extending along the first source contact and the second portion of the first 2D material includes a second curved profile extending along the first drain contact.

4. The device of claim 1, wherein the first carrier nanosheet includes silicon.

5. The device of claim 1, wherein:
   the first portion of the first carrier nanosheet is doped to form a first p-n junction with the first source contact, and
   the second portion of the first carrier nanosheet is doped to form a second p-n junction with the first drain contact.

6. The device of claim 1, further comprising a first dielectric layer insulating the first gate contact from the first source contact and a second dielectric layer insulating the first gate contact from the first drain contact.

7. The device of claim 5, wherein at least one of the first p-n junction or the second p-n junction is formed to operate in a reverse bias.

8. The device of claim 1, further comprising:
   a second source contact;
   a second drain contact;
   a second carrier nanosheet having a first portion and a second portion;
   a second 2D material forming a channel between the second source contact and the second drain contact and including a first portion, a second portion, and a third portion between the first and second portion, wherein the first and second portions respectively extend away from the third portion, wherein the first portion and the second portion of the second 2D material surround the first portion and the second portion of the second carrier nanosheet, respectively; and
   a second gate structure including a second gate dielectric and a second gate contact, the second gate structure surrounding at least the third portion of the second 2D material.

9. The device of claim 1, wherein the first portion of the first 2D material extends toward the first source contact and beyond the first portion of the first carrier nanosheet, and the second portion of the first 2D material extends toward the first drain contact and beyond the second portion of the first carrier nanosheet.

10. The device of claim 1, further comprising:
    a first dielectric layer interposed between the first portion of the first carrier nanosheet and the first 2D material; and
    a second dielectric layer interposed between the second portion of the first carrier nanosheet and the first 2D material.

11. The device of claim 10, wherein the first dielectric layer includes a portion interposed between the third portion of the first 2D material and the first portion of the first carrier nanosheet, and the second dielectric layer includes a portion interposed between the third portion of the first 2D material and the second portion of the first carrier nanosheet.

* * * * *